(12) United States Patent
Chin et al.

(10) Patent No.: US 10,558,381 B2
(45) Date of Patent: Feb. 11, 2020

(54) DYNAMIC READ TABLE GENERATION

(71) Applicant: SanDisk Technologies LLC, Plano, TX (US)

(72) Inventors: Henry Chin, Fremont, CA (US); Sateesh Desireddi, Sathupalli Mandal (IN); Dana Lee, Saratoga, CA (US); Ashwin D T, Bangalore (IN); Harshul Gupta, New Delhi (IN); Parth Amin, Fremont, CA (US); Jia Li, San Francisco, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/381,104

(22) Filed: Dec. 16, 2016

(65) Prior Publication Data
US 2018/0173447 A1 Jun. 21, 2018

(51) Int. Cl.
*G06F 3/06* (2006.01)

(52) U.S. Cl.
CPC .......... *G06F 3/0634* (2013.01); *G06F 3/0619* (2013.01); *G06F 3/0632* (2013.01); *G06F 3/0679* (2013.01)

(58) Field of Classification Search
CPC .... G06F 3/0634; G06F 3/0619; G06F 3/0632; G06F 3/0679
See application file for complete search history.

(56) References Cited

U.S. PATENT DOCUMENTS

| | | | |
|---|---|---|---|
| 7,113,432 B2 | 9/2006 | Mokhlesi | |
| 7,876,621 B2 * | 1/2011 | Sharon | G11C 11/5628 365/185.03 |
| 8,315,092 B2 | 11/2012 | Strasser et al. | |
| 8,380,915 B2 | 2/2013 | Wood et al. | |
| 8,406,053 B1 | 3/2013 | Dutta et al. | |
| 8,605,502 B1 | 12/2013 | Desireddi et al. | |
| 8,661,184 B2 | 2/2014 | Wood et al. | |
| 8,687,421 B2 | 4/2014 | Avila et al. | |
| 8,854,882 B2 | 10/2014 | Strasser et al. | |
| 8,873,286 B2 | 10/2014 | Strasser et al. | |
| 8,982,619 B2 | 3/2015 | Strasser et al. | |
| 9,036,417 B2 | 5/2015 | Chen et al. | |
| 9,208,897 B2 | 12/2015 | Strasser et al. | |
| 9,361,029 B2 | 6/2016 | Strasser et al. | |

(Continued)

OTHER PUBLICATIONS

PCT/US17/49748 International Search Report and Written Opinion dated Jan. 22, 2018.

(Continued)

*Primary Examiner* — Francisco A Grullon
(74) *Attorney, Agent, or Firm* — Vierra Magen Marcus LLP

(57) ABSTRACT

Apparatuses, systems, methods, and computer program products are disclosed for dynamic read table generation. One apparatus includes a set of non-volatile storage cells. A controller for a set of non-volatile storage cells is configured to, in response to unsuccessfully reading a storage cell of the set of non-volatile storage cells using a parameter, read the storage cell using one or more shifted values. A controller for a set of non-volatile storage cells is configured to, in response to successfully reading a storage cell using one or more shifted values, add the one or more shifted values to a storage device.

19 Claims, 17 Drawing Sheets

(56) References Cited

U.S. PATENT DOCUMENTS

| | | | | |
|---|---|---|---|---|
| 9,633,740 B1* | 4/2017 | Alhussien | ............... | G11C 16/28 |
| 9,727,276 B2* | 8/2017 | Darragh | ................ | G06F 3/0653 |
| 9,792,071 B2* | 10/2017 | Gorobets | .............. | G06F 3/0653 |
| 9,846,554 B1* | 12/2017 | Lai | ........................ | G06F 3/0604 |
| 10,101,931 B1* | 10/2018 | Camp | ................... | G06F 3/0619 |
| 2012/0268994 A1* | 10/2012 | Nagashima | .......... | G06F 11/1048 |
| | | | | 365/185.11 |
| 2013/0070524 A1* | 3/2013 | Dutta | .................. | G11C 11/5642 |
| | | | | 365/185.03 |
| 2013/0128666 A1* | 5/2013 | Avila | .................. | G06F 11/1048 |
| | | | | 365/185.11 |
| 2013/0132652 A1* | 5/2013 | Wood | .................. | G06F 12/0246 |
| | | | | 711/103 |
| 2014/0063940 A1* | 3/2014 | Chen | ................... | G11C 11/5628 |
| | | | | 365/185.03 |
| 2014/0258590 A1* | 9/2014 | Kochar | ............... | G06F 12/0246 |
| | | | | 711/103 |
| 2015/0348649 A1* | 12/2015 | Yang | ....................... | G11C 29/44 |
| | | | | 714/723 |
| 2016/0093396 A1* | 3/2016 | Alhussien | .......... | H03M 13/1125 |
| | | | | 365/185.21 |
| 2016/0093397 A1* | 3/2016 | Tabrizi | ............... | G11C 16/3495 |
| | | | | 711/103 |
| 2016/0170871 A1* | 6/2016 | Hyun | .................... | G06F 3/0679 |
| | | | | 711/103 |

OTHER PUBLICATIONS

PCT/US17/49748 Invitation to Pay Additional Fees; Partial Search Report dated Nov. 29, 2017.

* cited by examiner

Global Table
720

| C\G  | -300 | -250 | -200 | -150 | -100 | -50 | 0  | +50 | +100 |
|------|------|------|------|------|------|-----|----|-----|------|
| -200 | 57   | 50   | 37   | 39   | 41   | 43  | 45 | 47  | 49   |
| -150 | 58   | 51   | 38   | 26   | 28   | 30  | 32 | 34  | 36   |
| -100 | 59   | 52   | 40   | 27   | 10   | 12  | 14 | 16  | 18   |
| -50  | 60   | 53   | 42   | 29   | 11   | 2   | 4  | 6   | 20   |
| 0    | 61   | 54   | 44   | 31   | 13   | 3   | 1  | 8   | 22   |
| +50  | 62   | 55   | 46   | 33   | 15   | 5   | 7  | 9   | 24   |
| +100 | 63   | 56   | 48   | 35   | 17   | 19  | 21 | 23  | 25   |

FIG. 8A

| Case | Global Table 720 | | Global Table 720a | | DRT 730a | | Global Table 720b | | DRT 730b | |
|---|---|---|---|---|---|---|---|---|---|---|
| | Initial GCL | | Die 1 GCL | | Die 1 DRT | | Die 2 GCL | | Die 2 DRT | |
| | C Shift | G Shift | C Shift | G Shift | C Shift | G Shift | C Shift | G Shift | C Shift | G Shift |
| 1 | 0 | 0 | 50 | -50 | 0 | 0 | -50 | 0 | 0 | 0 |
| 2 | -50 | -50 | -50 | 50 | -50 | -50 | 50 | -50 | -50 | -50 |
| 3 | 0 | -50 | 50 | 50 | 0 | -50 | -50 | 50 | 0 | -50 |
| 4 | -50 | 0 | -100 | 0 | -50 | 0 | 50 | 0 | -50 | -100 |
| 5 | 50 | -50 | 50 | -100 | 50 | 0 | 0 | 50 | 0 | -100 |
| 6 | -50 | 50 | -100 | 50 | 0 | 50 | 50 | 50 | -100 | -150 |
| 7 | 50 | 0 | 100 | -100 | -100 | -100 | -100 | -100 | -50 | -150 |
| 8 | 0 | 50 | -100 | 100 | -50 | -100 | -100 | -50 | -150 | -200 |
| 9 | 50 | 50 | 100 | -50 | -100 | -50 | -100 | 0 | -100 | -200 |
| 10 | -100 | -100 | -50 | 100 | 0 | -100 | 50 | -100 | -50 | -200 |
| 11 | -50 | -100 | 100 | 0 | -50 | -150 | -100 | 50 | -100 | -250 |
| 12 | -100 | -50 | 0 | 100 | | | 100 | -100 | | |
| 13 | 0 | -100 | 100 | 50 | | | -100 | 100 | | |
| 14 | -100 | 0 | 50 | 100 | | | 100 | -50 | | |
| ... | | | | | | | | | | |
| 51 | -150 | -250 | 50 | -300 | | | 50 | -300 | | |
| 52 | -100 | -250 | 100 | -300 | | | 100 | -300 | | |
| 53 | -50 | -250 | | | | | | | | |
| 54 | 0 | -250 | | | | | | | | |
| 55 | 50 | -250 | | | | | | | | |
| 56 | 100 | -250 | | | | | | | | |
| 57 | -200 | -300 | | | | | | | | |
| 58 | -150 | -300 | | | | | | | | |
| 59 | -100 | -300 | | | | | | | | |
| 60 | -50 | -300 | | | | | | | | |
| 61 | 0 | -300 | | | | | | | | |
| 62 | 50 | -300 | | | | | | | | |
| 63 | 100 | -300 | | | | | | | | |

FIG. 8D

DYNAMIC READ TABLE GENERATION

TECHNICAL FIELD

The present disclosure, in various embodiments, relates to storage devices and more particularly relates to dynamic read table generation for storage devices.

BACKGROUND

Many data storage devices, such as flash memory devices, store data in cells of non-volatile media. A physical property of each cell, such as a stored charge, voltage, material phase, electrical resistance, magnetization, or the like, is alterable to encode data. A cell's physical property may be variable across a range, which may be divided into discrete states, so that different states correspond to different data values. Sensing whether the cell's physical property satisfies one or more read thresholds (e.g., voltage thresholds, resistivity thresholds, or the like) within its range determines the cell's state, thus allowing recovery of a stored data value.

In certain configurations, different values may be used for reading cells. For example, a lookup table with different values may be used to access values to read cells that are not readable using nominal values.

SUMMARY

Apparatuses are presented for dynamic read table generation. In one embodiment, an apparatus includes a set of non-volatile storage cells. A controller for a set of non-volatile storage cells, in certain embodiments, is configured to, in response to unsuccessfully reading a storage cell of the set of non-volatile storage cells using a parameter, read the storage cell using one or more shifted values. A controller for a set of non-volatile storage cells, in one embodiment, is configured to, in response to successfully reading a storage cell using one or more shifted values, add the one or more shifted values to a storage device.

Methods are presented for dynamic read table generation. A method, in one embodiment, includes iteratively attempting to read a storage cell using a predetermined number of table entries of a dynamic read table. In a further embodiment, a method includes in response to unsuccessfully reading a storage cell via iterative attempts, iteratively attempting to read the storage cell using table entries of a global table until the storage cell is successfully read using a successful table entry of the global table. A method, in certain embodiments, includes adding a successful entry of a global table to a dynamic read table.

An apparatus for dynamic read table generation, in one embodiment, includes means for performing one or more reads on a storage cell using one or more table entries of a dynamic read table. In certain embodiments, an apparatus includes means for performing a low read on a storage cell using a low read value shifted by an offset and a high read on the storage cell using a high read value shifted by the offset in response to one or more reads being unsuccessful. In various embodiments, an apparatus includes means for adding a low read value shifted by an offset and a high read value shifted by an offset to a dynamic read table in response to a low read on a storage cell using a low read value shifted by the offset and a high read on the storage cell using a high read value shifted by the offset being successful.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which:

FIG. 8A is a schematic block diagram illustrating one embodiment of a global table;

FIG. 8D is a schematic block diagram illustrating one embodiment of global tables and dynamic read tables;

DETAILED DESCRIPTION

Figure 1A:
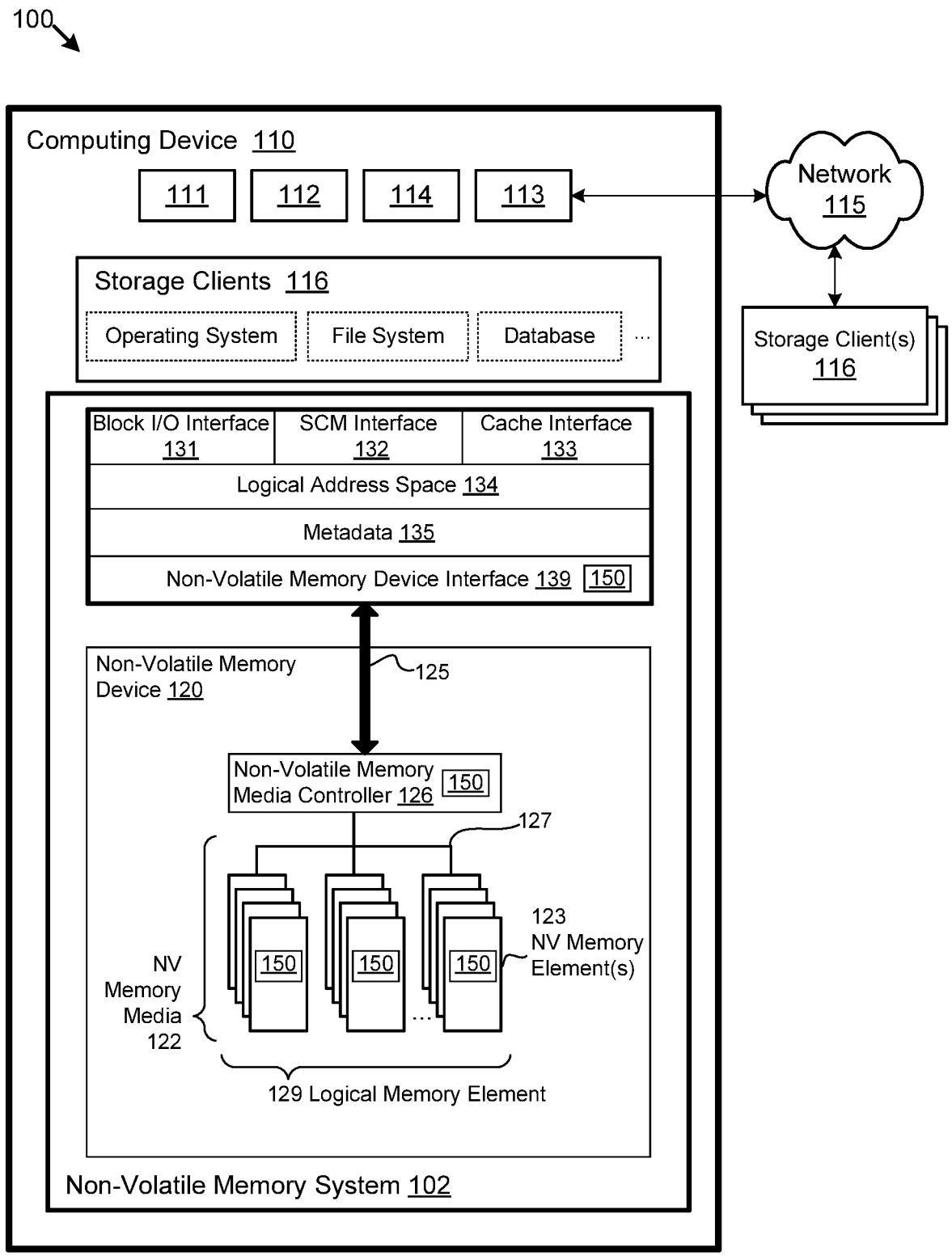
FIG. 1A is a schematic block diagram illustrating one embodiment of a system for dynamic read table generation.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures Like numbers may refer to like elements in the figures, including alternate embodiments of like elements.

FIG. 1A is a block diagram of one embodiment of a system 100 comprising a dynamic read table (DRT) generator 150 for a non-volatile memory device 120. The DRT generator 150 may be part of and/or in communication with a non-volatile memory media controller 126, a non-volatile memory element 123, a device driver, or the like. The DRT generator 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein. Alternatively, or in addition, the DRT generator 150 may be embodied as one or more computer readable instructions stored on the non-transitory storage medium 114.

The non-volatile memory system 102, in the depicted embodiment, includes a DRT generator 150. The DRT generator 150, in one embodiment, is configured to adaptively generate a DRT for the non-volatile memory device 120 described below. The DRT generator 150, in certain embodiments, may, in response to unsuccessfully reading a storage cell (e.g., memory cell) of a set of non-volatile storage cells using a parameter (e.g., a table entry in a DRT, a stored value, or the like), read the storage cell using one or more shifted values (e.g., one or more shifted read voltages, bit line bias voltages, or the like).

As used herein, a parameter is a setting for and/or another aspect of an operation for the non-volatile memory device 120. A parameter may comprise a read setting such as a read voltage threshold, a resistivity threshold, a bit line bias voltage, a sense time, or the like. A parameter may comprise a program setting such as a program voltage level that specifies the minimum or maximum voltage used to program or change a state of a storage cell, a step magnitude for an incremental step pulse programming operation, a maximum number of iterations for an incremental step pulse programming operation, a program verify threshold for a program operation, an initial voltage bias for an incremental step pulse programming operation, or the like. A parameter may comprise an erase setting for erasing storage cells, such as a step magnitude for an incremental step pulse erase operation, a maximum number of iterations for an incremental step pulse erase operation, an erase verify voltage threshold for an erase operation, an initial voltage bias for an incremental step pulse erase operation, or the like. One of skill in the art, in light of this specification, will recognize other parameters for storage cells which may be managed by the DRT generator 150.

A parameter may refer to a value stored as an entry in a DRT, a value stored in a latch, a value stored in a memory, a calculated value, a retrieved value, or the like. The DRT generator 150 may also, in response to successfully reading a storage cell using one or more shifted values, add the one or more shifted values to a set of values for reading the storage cell (e.g., a DRT, a data store, or the like). Thus, in certain embodiments, a size of a DRT may be smaller than in other embodiments, and the DRT may be adapted to the non-volatile memory system 102 where the DRT is located.

As used herein, a dynamic read table or DRT is a data structure that stores or otherwise tracks values for one or more parameters. For example, a DRT may comprise a table of parameter values used for reading one or more storage cells, a data store including parameter values used for reading one or more storage cells (e.g., a database, one or more database tables, or the like), a list of parameter values used for reading one or more storage cells (e.g., a linked list, an array, a queue, a stack), a record including parameter values for reading one or more storage cells (e.g., a tuple, struct, and/or another aggregate data structure comprising one or more fields or members), a tree including parameter values for reading one or more storage cells, a set of storage cells storing parameter values used for reading one or more other storage cells, a group of values used for reading one or more storage cells, or the like. In one embodiment, each entry in a DRT may include one value used for reading a storage cell. The value may be a voltage level, a current level, an adjustment size and/or direction, a time period, a step size, or the like.

In one embodiment, the DRT generator 150 may comprise logic hardware of one or more non-volatile memory devices 120, such as a non-volatile memory media controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the DRT generator 150 may comprise executable software code, such as a device driver or the like, stored on the computer readable storage medium 114 for execution on the processor 111. In a further embodiment, the DRT generator 150 may include a combination of both executable software code and logic hardware.

In one embodiment, the DRT generator 150 is configured to receive storage requests from a device driver or other executable application via a bus 125 or the like. The DRT generator 150 may be further configured to transfer data to/from a device driver and/or storage clients 116 via the bus 125. Accordingly, the DRT generator 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the DRT generator 150 may receive storage requests as an API call from a storage client 116, as an IO-CTL command, or the like.

According to various embodiments, a non-volatile memory controller 126 in communication with one or more DRT generators 150 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the non-volatile memory media controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective non-volatile memory media controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more non-volatile memory media controllers 126.

A device driver may present a logical address space 134 to the storage clients 116 through one or more interfaces. As discussed above, the logical address space 134 may comprise a plurality of logical addresses, each corresponding to respective media locations on one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 126 is part of and/or in communication with one or more non-volatile memory devices 120. Although FIG. 1A depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, or the like. A non-volatile memory media controller 126 may be configured to manage data operations on the non-volatile memory media 122, and may comprise one or more processors, programmable processors (e.g., FPGAs), ASICs, micro-controllers, or the like. In some embodiments, the non-volatile memory media controller 126 is configured to store data on and/or read data from the non-volatile memory media 122, to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The non-volatile memory controller 126 may organize a block of word lines within a non-volatile memory element 123, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within a non-volatile memory element 123 may be physically arranged in a monotonically increasing sequence of word line addresses, with consecutively addressed word lines also being physically adjacent (e.g., WL0, WL1, WL2, . . . WLN).

The non-volatile memory controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102.

A device driver may further comprise a non-volatile memory device interface 139 that is configured to transfer data, commands, and/or queries to the non-volatile memory media controller 126 over a bus 125, as described above.

Figure 1B:
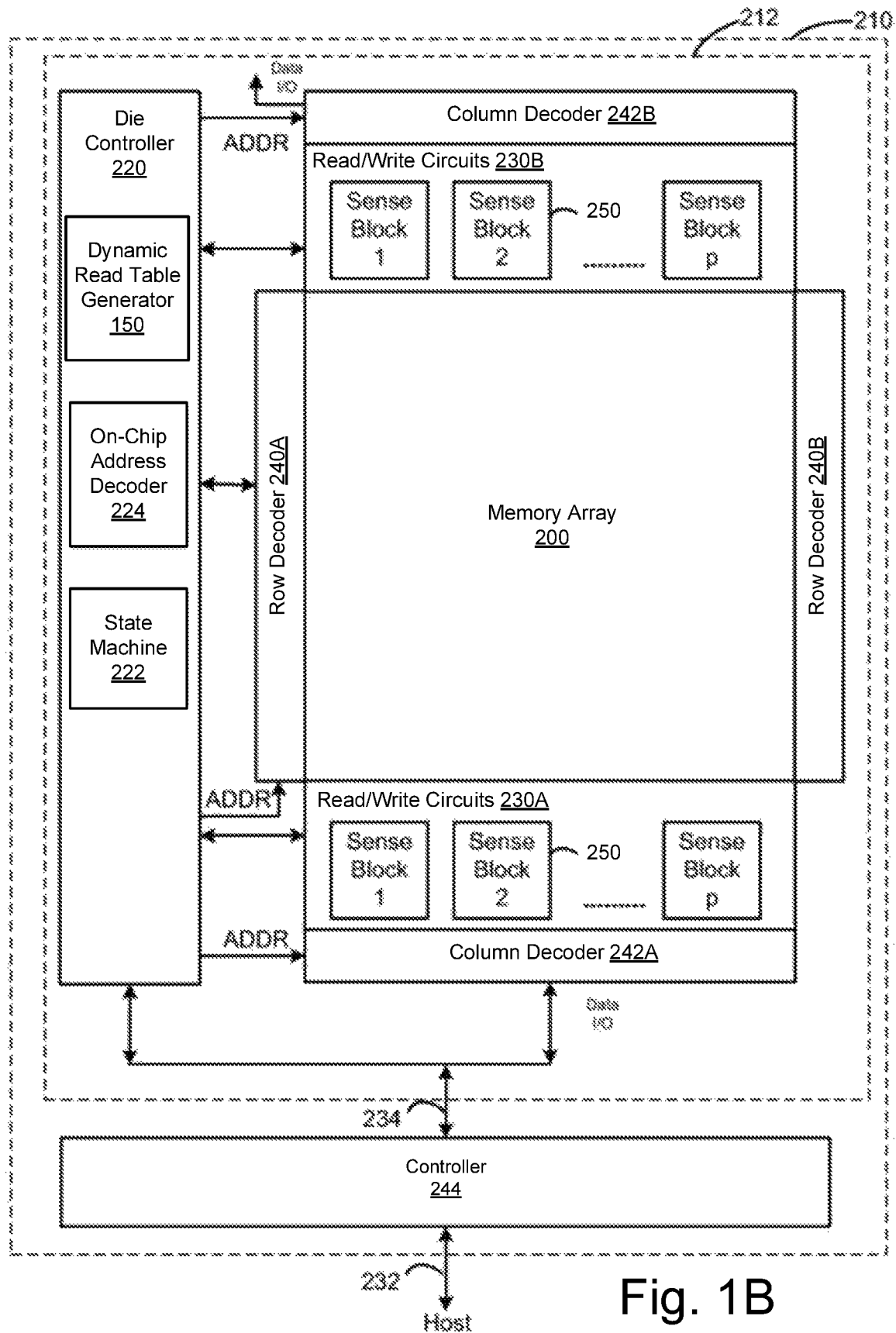
FIG. 1B is a schematic block diagram illustrating another embodiment of a system for dynamic read table generation.

FIG. 1B illustrates an embodiment of a non-volatile storage device 210 that may include one or more memory die or chips 212. Memory die 212, in some embodiments, includes an array (two-dimensional or three dimensional) of memory cells 200, die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Die controller 220, in one embodiment, cooperates with the read/write circuits 230A/230B to perform memory operations on the memory array 200. The die controller 220, in certain embodiments, includes a DRT generator 150, a state machine 222, and an on-chip address decoder 224. In one embodiment, the state machine 222 comprises at least a portion of the DRT generator 150. In a further embodiment, the controller 244 comprises at least a portion of the DRT generator 150.

The DRT generator 150, in one embodiment, is configured to iteratively attempt to read a storage cell using a predetermined number of table entries of a DRT, in response to unsuccessfully reading the storage cell via iterative attempts, iteratively attempt to read the storage cell using table entries of a global table until the storage cell is successfully read using a successful table entry of the global table, and add a successful entry of the global table to the DRT.

The state machine 222, in one embodiment, provides chip-level control of memory operations. The on-chip address decoder 224 provides an address interface to convert between the address that is used by the host or a memory controller to the hardware address used by the decoders 240A, 240B, 242A, 242B. In certain embodiments, the state machine 222 includes an embodiment of the DRT generator 150. The DRT generator 150, in some embodiments, performs one or more reads on a storage cell using one or more table entries of a DRT. The DRT generator 150, in certain embodiments, is embodied as software in a device driver, hardware in a device controller 244, and/or hardware in a die controller 220 and/or state machine 222.

In one embodiment, one or any combination of die controller 220, DRT generator 150, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 2:
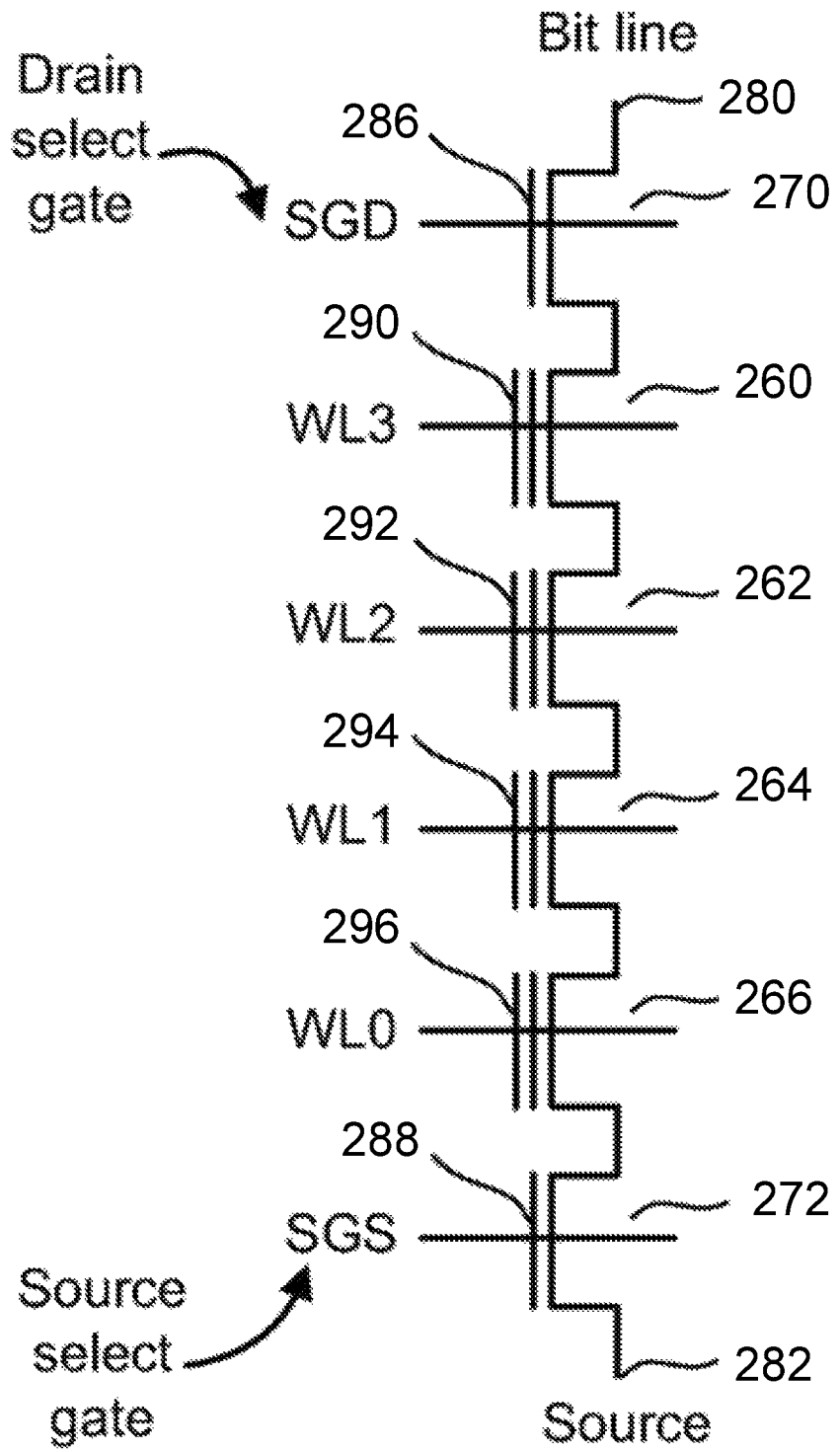
FIG. 2 is a schematic block diagram illustrating one embodiment of a string of storage cells.

FIG. 2 depicts one embodiment of a NAND string comprising a plurality of storage elements. The NAND string depicted in FIG. 2, in some embodiments, includes four transistors 260, 262, 264, 266 connected in series and located between a first select transistor 270 and a second select transistor 272. In some embodiments, a transistor 260, 262, 264, 266 includes a control gate and a floating gate. A control gate 290, 292, 294, 296, in one embodiment, is connected to, or comprises a portion of, a word line. In a further embodiment, a transistor 260, 262, 264, 266 is a storage element, storage cell, or the like, also referred to as a memory cell. In some embodiments, a storage element may include multiple transistors 260, 262, 264, 266.

The first select transistor 270, in some embodiments, gates/connects the NAND string connection to a bit line 280 via a drain select gate SGD. The second select transistor 272, in certain embodiments, gates/connects the NAND string connection to a source line 282 via a source select gate SGS. The first select transistor 270, in a further embodiment, is controlled by applying a voltage to a corresponding select gate 286. The second select transistor 272, in some embodiments, is controlled by applying a voltage to corresponding select gate 288.

As shown in FIG. 2, the source line 282, in one embodiment, is connected to the sources of each transistor/storage cell 260, 262, 264, 266 in the NAND string. The NAND string, in some embodiments, may include some storage elements 260, 262, 264, 266 that have been programmed and some storage elements 260, 262, 264, 266 that have not been programmed. As described in more detail below, the DRT generator 150 determines shifted values for reading the storage elements 260, 262, 264, 266 (e.g., a read voltage applied to a word line, read current, sense time for a sense amplifier, bit line voltage bias, and/or another read value used to read information stored in one or more storage elements 260, 262, 264, 266). The shifted values may be determined after attempting to read the storage elements 260, 262, 264, 266 without the shifted values. The DRT generator 150, in some embodiments, may add shifted values to a DRT.

In various embodiments, instead of, or in addition to, a read voltage applied to a cell source and/or a sense time, a read value, a program value, or the like may comprise one or more bit line inputs, such as bit line bias voltages or the like. In embodiments in which the read value comprises multiple bit line voltages for different storage cells, the bit line voltages may be concurrently applied to the different storage cells during the same operation (e.g., a read operation, a program operation, an erase operation, or the like) and may be different from one another. For example, a first one or more bit lines may have a first voltage applied, while a second one or more bit lines may have a second voltage applied, with the first voltage being different from the second voltage. In certain embodiments, the read setting includes multiple sense times for one or more sense amplifiers.

As used herein, a bit line input may be a voltage, a current, a voltage differential, and/or another input for a bit line of one or more storage cells, based on an architecture (e.g., NAND flash or other charge trapping storage, resistive storage such as ReRAM or Memristor memory, or the like) of cells, based on an operation being performed (e.g., read, erase, program, or the like), and/or on another factor. A bit line input may be applied to a bit line and/or a word line (e.g., to adjust a voltage differential or bias between the bit line and the word line) of one or more storage cells during a read and/or program operation, to bias the bit line to a certain level. For example, for NAND flash and/or another charge trapping storage technology, a read operation may use a parasitic capacitance of the bit line as part of a read operation by pre-charging the bit line to a bit line voltage. A nominal or default bit line voltage for a read operation, in one embodiment, may be about 0.2 volts, about 0.5 volts, about 1.0 volts, and/or another predefined voltage value, based on, or depending on, a difference between a voltage applied to the word line and the bit line or the like to create a desired voltage differential.

During the read operation, if the storage cell is erased or has a stored threshold voltage below a read voltage threshold applied to the word line (e.g., to the control gate of the storage cell), in certain embodiments, the storage cell sinks current and discharges the bit line (e.g., an erased cell has a negative threshold voltage). If the storage cell is programmed (e.g., has a stored threshold voltage above a read voltage threshold applied to the word line), it does not sink current and the bit line keeps its pre-charged, biased value. Sense amplifiers 250 may sense currents of bit lines (e.g., whether or not the cell is sinking current) for a selected word line of storage cells to determine the stored data values of the word line.

Figure 3:
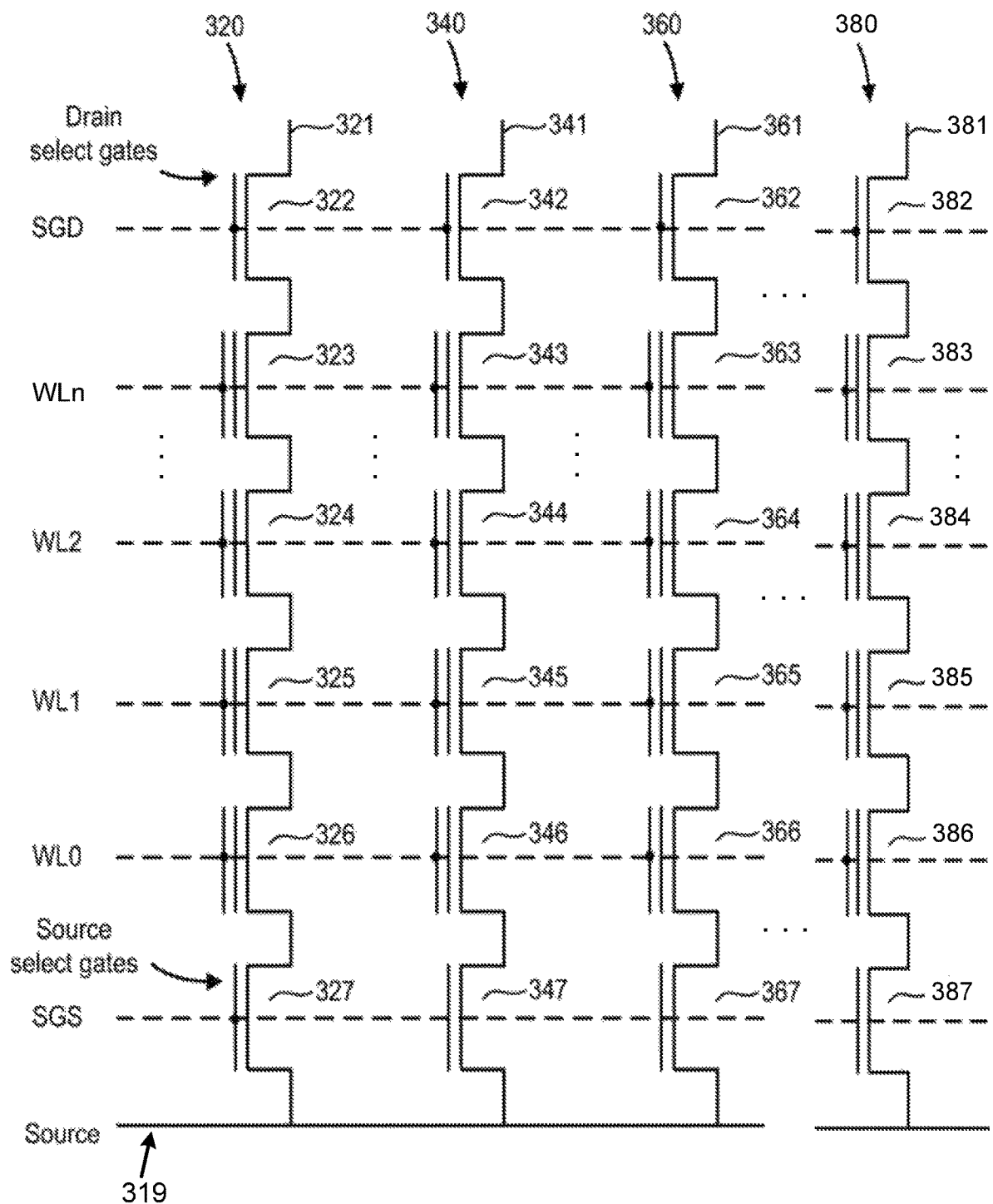
FIG. 3 is a schematic block diagram illustrating one embodiment of an array of storage cells.

FIG. 3 is a circuit diagram depicting a plurality of NAND strings 320, 340, 360, 380. An architecture for a flash memory system using a NAND structure may include several NAND strings 320, 340, 360, 380. For example, FIG. 3 illustrates NAND strings 320, 340, 360, 380 in a memory array 200 that includes multiple NAND strings 320, 340, 360, 380. In the depicted embodiment, each NAND string 320, 340, 360, 380 includes drain select transistors 322, 342, 362, 382, source select transistors 327, 347, 367, 387, and storage elements 323-326, 343-346, 363-366, 383-386. While four storage elements 323-326, 343-346, 363-366, 383-386 per NAND string 320, 340, 360, 380 are illustrated for simplicity, some NAND strings 320, 340, 360, 380 can include any number of storage elements, e.g., thirty-two, sixty-four, or the like storage elements.

NAND strings 320, 340, 360, 380, in one embodiment, are connected to a source line 319 by source select transistors 327, 347, 367, 387. A selection line SGS may be used to control the source side select transistors. The various NAND strings 320, 340, 360, 380, in one embodiment, are connected to bit lines 321, 341, 361, 381 by drain select transistors 322, 342, 362, 382. The drain select transistors 322, 342, 362, 382 may be controlled by a drain select line SGD. In some embodiments, the select lines do not necessarily need to be in common among the NAND strings 320, 340, 360, 380; that is, different select lines can be provided for different NAND strings 320, 340, 360, 380.

As described above, each word line WL0-WLn comprises one or more storage elements 323-383, 324-384, 325-385, 326-386. In the depicted embodiment, each bit line 321, 341, 361, 381 and the respective NAND string 320, 340, 360, 380 comprise the columns of the memory array 200, storage block, erase block, or the like. The word lines WL0-WLn, in some embodiments, comprise the rows of the memory array 200, storage block, erase block, or the like. Each word line WL0-WLn, in some embodiments, connects the control gates of each storage element 323-383, 324-384, 325-385, 326-386 in a row. Alternatively, the control gates may be provided by the word lines WL0-WLn themselves. In some embodiments, a word line WL0-WLn may include tens, hundreds, thousands, millions, or the like of storage elements 323-383, 324-384, 325-385, 326-386.

In one embodiment, each storage element 323-326, 343-346, 363-366, 383-386 is configured to store data. For example, when storing one bit of digital data, the range of possible threshold voltages (VTH) of each storage element 323-326, 343-346, 363-366, 383-386 may be divided into two ranges which are assigned logical data "1" and "0." In one example of a NAND type flash memory, the VTH may be negative after the storage elements 323-326, 343-346, 363-366, 383-386 are erased, and defined as logic "1." In one embodiment, the VTH after a program operation is positive and defined as logic "0."

When the VTH is negative and a read is attempted, in some embodiments, storage elements 323-326, 343-346, 363-366, 383-386 will turn on to indicate logic "1" is being stored. When the VTH is positive and a read operation is attempted, in a further embodiment, a storage element will not turn on, which indicates that logic "0" is stored. Each storage element 323-383, 324-384, 325-385, 326-386 may also store multiple levels of information, for example, multiple bits of digital data. In such an embodiment, the range of VTH value is divided into the number of levels of data. For example, if four levels of information can be stored in each storage element 323-326, 343-346, 363-366, 383-386, there will be four VTH ranges assigned to the data values "11", "10", "01", and "00."

In one example of a NAND type memory, the VTH after an erase operation may be negative and defined as "11." Positive VTH values may be used for the states of "10", "01", and "00." In one embodiment, the specific relationship between the data programmed into the storage elements 323-326, 343-346, 363-366, 383-386 and the threshold voltage ranges of the storage elements 323-326, 343-346, 363-366, 383-386 depends upon the data encoding scheme adopted for the storage elements 323-326, 343-346, 363-366, 383-386.

In some embodiments, when a read operation is performed, values in a DRT for reading one or more storage elements 323-326, 343-346, 363-366, 383-386 may be ineffective (e.g., due to drifted stored voltage levels or the like), which may result in incorrectly reading the one or more storage elements 323-326, 343-346, 363-366, 383-386, data errors, or the like. In such an embodiment, the DRT generator 150 may shift the values applied to the one or more storage elements 323-326, 343-346, 363-366, 383-386 for reading the one or more storage elements 323-326, 343-346, 363-366, 383-386, and store the shifted values in the DRT.

Figure 4:
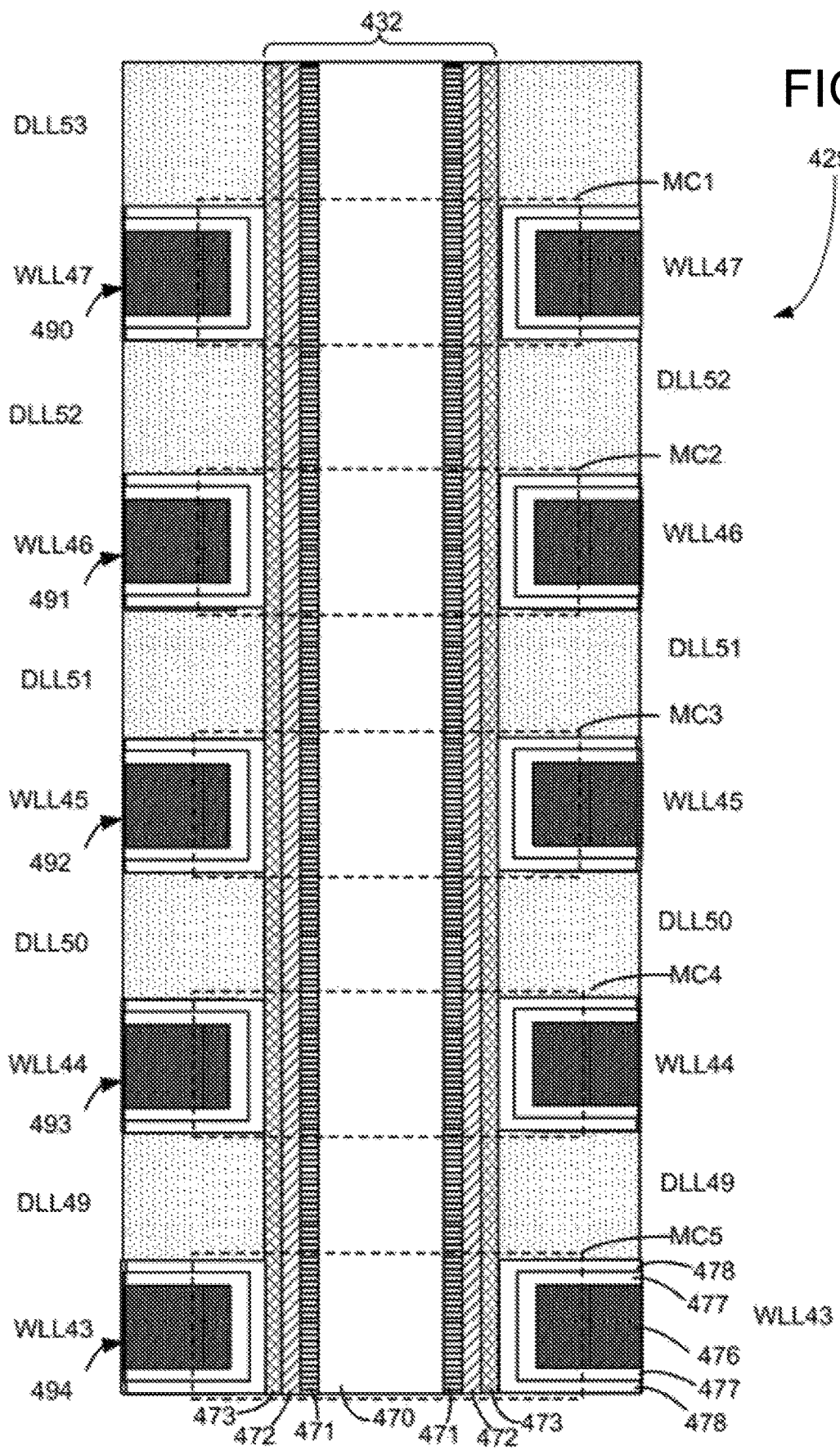
FIG. 4 illustrates one embodiment of a 3D, vertical NAND flash memory structure.

FIG. 4 illustrates one embodiment of a cross sectional view of a 3D, vertical NAND flash memory structure 429 or string 429. In one embodiment, the vertical column 432 is round and includes four layers; however, in other embodiments more or less than four layers can be included and other shapes can be used (e.g., a "U" shape instead of an "I" shape or the like). In one embodiment, a vertical column 432 includes an inner core layer 470 that is made of a dielectric, such as SiO2. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is a shared charge trapping layer 473, such as (for example) Silicon Nitride. Other materials and structures can also be used. The technology described herein is not limited to any particular material or structure.

FIG. 4 depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide (SiO2) layer 478. The physical interaction of the word line layers with the vertical column forms the memory cells. Thus, a memory cell, in one embodiment, comprises channel 471, tunneling dielectric 472, charge trapping layer 473 (e.g., shared with other memory cells), blocking oxide layer 478, aluminum oxide layer 477 and word line region 476. In some embodiments, the blocking oxide layer 478 and aluminum oxide layer 477, may be replaced by a single layer of material with insulating properties or by more than 2 layers of different material with insulating properties. Furthermore, the materials used are not limited to silicon dioxide (SiO2) or aluminum oxide. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Storage cells in the same location or position in different memory structures 429 (e.g., different NAND strings 429) on different bit lines, in certain embodiments, may be on the same word line. Each word line may store one page of data, such as when 1-bit of data is stored per cell (SLC); two pages of data, such as when 2-bits of data are stored per cell (MLC); three pages of data, such as when 3-bits of data are stored per cell (TLC); four pages of data, such as when 4-bits of data are stored per cell (QLC); or another number of pages of data.

In the depicted embodiment, a vertical, 3D NAND flash memory structure 429 comprises an "I" shaped memory structure 429. In other embodiments, a vertical, 3D NAND flash memory structure 429 may comprise a "U" shaped structure, or may have another vertical and/or stacked architecture. In certain embodiments, four sets of strings 429 (e.g., four sets of 48 word lines, or another predefined number of word lines) may form an erase block, while in other embodiments, fewer or more than four sets of strings 429 may form an erase block. As may be appreciated, any suitable number of storage cells may be part of a single string 429. In one embodiment, a single string 429 includes 48 storage cells.

Figure 5A:
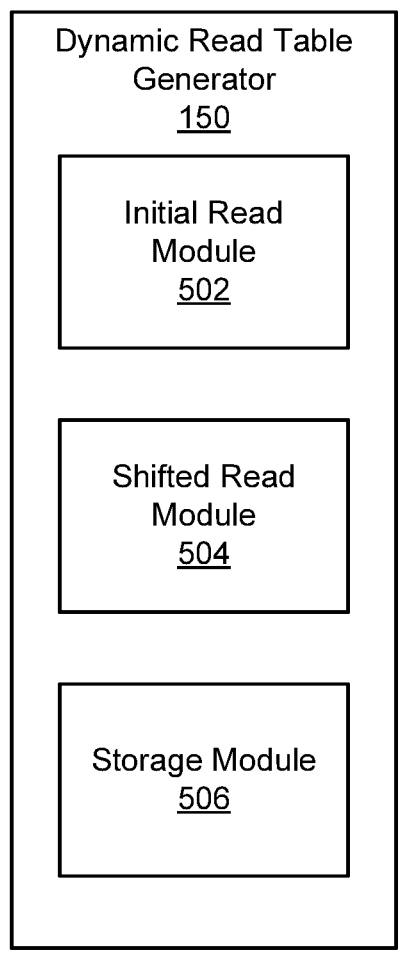
FIG. 5A is a schematic block diagram illustrating one embodiment of a dynamic read table generator.

FIG. 5A depicts one embodiment of a DRT generator 150. The DRT generator 150 may be substantially similar to the DRT generator 150 described above with regard to FIGS. 1A, 1B, 2, and/or 3. In general, as described above, the DRT generator 150 determine new entries to be added to a DRT. In the depicted embodiment, the DRT generator 150 includes an initial read module 502, a shifted read module 504, and a storage module 506.

In various embodiments, the initial read module 502 initializes a DRT with a default case (e.g., a default read value, a default shift for a read value, or the like). A read value, in various embodiments, may include a read voltage applied to a word line, a bit line voltage (e.g., a bit line bias voltage used during a read operation), a read current, a sense time for a sense amplifier, and/or some other value or input used to read information stored in one or more storage cells. The default case may be a zero shift case. Moreover, in some embodiments, the initial read module 502 initializes a pointer to point to a first case (e.g., the default case, an initial table entry, or the like) in the DRT. The initial read module 502, in certain embodiments, reads a memory cell (e.g., one or more memory cells, one or more storage cells) using the DRT case pointed to. In one embodiment, the initial read module may read a memory cell using any suitable parameter (e.g., a value stored in a latch, a value stored in a memory, or the like).

The initial read module 502 may determine whether the data stored in the memory cell is successfully read and/or decoded. Unsuccessfully reading and/or decoding data from a storage cell, as used herein, may comprise encountering a data error (e.g., an uncorrectable bit error, a raw bit error, or the like) in a read for the storage cell. The data error, in certain embodiments, may not necessarily be for data of the storage cell itself, but for data of an error-correcting code (ECC) code word, page, and/or word line comprising the storage cell and/or data of the storage cell. For example, the initial read module 502 may determine that read data is not correctable using ECC checkbits for the data, but depending on the number of data errors, may not be able to determine for which storage cells the data errors occurred.

As used herein, successfully decoding and/or successfully reading a memory cell may comprise correctly determining data stored by (e.g., previously written and/or programmed to) the memory cell (e.g., decoding and/or reading information from the memory cell that matches information provided to the memory cell for storage) in a read for the storage cell (e.g., a read of a page, word line, or the like comprising the storage cell). In certain embodiments, a read operation is successful if an ECC decoder can correct any errors in the read data to determine the correct, previously written values for the data. In response to determining that the data stored in the memory cell is successfully decoded, the initial read module 502 may indicate a read success. However, in response to determining that the data stored in the memory cell is unsuccessfully decoded, the initial read module 502 may determine whether the case pointed to in the DRT is a last case in the table (e.g., last table entry).

In response to determining that the case pointed to in the DRT is not the last case in the table, the initial read module 502 may advance the pointer to point to the next case in the DRT, and then the initial read module may repeat reading the memory cell using the DRT case pointed to. Accordingly, the initial read module 502 may iteratively attempt to read a memory cell using a predetermined number of table entries of a DRT. In certain embodiments, the predetermined number of table entries is one. In some embodiments, the predetermined number of table entries includes a default entry indicating to perform a read using a nominal voltage.

In response to the initial read module 502 unsuccessfully reading a storage cell (e.g., determining that the case pointed to in the DRT is the last case in the table), in one embodiment, the shifted read module 504 initializes a pointer to point to a first case in a global case list (GCL) and/or a global dynamic read table. The GCL may include one or more values that may be used for reading a memory cell. In one embodiment, the GCL may only include a default and/or last used value. In another embodiment, the GCL may include possible values to be used to read a memory cell. In certain embodiments, the GCL may only include values not included in the DRT.

By initializing the pointer to the first case in the GCL, a case that is closest to the default GCL case may be obtained. The shifted read module 504 reads the memory cell using the GCL case pointed to. The shifted read module 504 then determines whether the data stored in the memory cell is successfully decoded.

In response to determining that the data stored in the memory cell is unsuccessfully decoded, the shifted read module 504 determines whether the case pointed to in the GCL is a last case in the table (e.g., last table entry). In response to determining that the case pointed to in the GCL is the last case in the table, the shifted read module 504 indicates a read failure (e.g., unsuccessful error correction code (UECC), uncorrectable data error, or the like).

In response to determining that the case pointed to in the GCL is not the last case in the table, the shifted read module 504 advances the pointer to point to the next case in the GCL, and then repeats reading the memory cell using the GCL case pointed to.

In certain embodiments, the shifted read module 504 reads memory cells using one or more default values and/or last passing values (e.g., retrieved from a GCL, retrieved from a memory cell, retrieved from a latch, or the like) and stores the results (e.g., in a latch, in a memory cell, or the like). In one embodiment, the one or more default values may be a first default value and a second default value. The shifted read module 504 may read the memory cells using the first default value plus a positive delta (e.g., offset) and using the second default value plus the positive delta.

The shifted read module 504 may determine whether the data stored in the memory cells is successfully decoded. In response to determining that the data stored in the memory cells is unsuccessfully decoded, the shifted read module 504 compares the prior two reads to identify a number of bit flips (e.g., a number of changes in read results). The bit flips may be classified as first positive delta flips corresponding to the number of bit flips resulting from the first default value read and the first default value read plus the positive delta read. Moreover, the bit flips may be classified as second positive delta flips corresponding to the number of bit flips resulting from the second default read and the second default read plus the positive delta read. The shifted read module 504 may read the memory cells using the first default value plus a negative delta and using the second default value plus the negative delta.

The shifted read module 504 may determine whether the data stored in the memory cells is successfully decoded. In response to determining that the data stored in the memory cells is unsuccessfully decoded, the shifted read module 504 compares the prior read with the initial read to identify a number of bit flips. The bit flips may be classified as first negative delta flips corresponding to the number of bit flips resulting from the first default value read and the first default value read plus the negative delta read. Moreover, the bit flips may be classified as second negative delta flips corresponding to the number of bit flips resulting from the second default value read and the second default value plus the negative delta read.

The shifted read module 504 may determine whether the first default value and/or the second default value are at the optimal read values. This may be accomplished by comparing the first positive delta flips with the first negative delta flips, and by comparing the second positive delta flips with the second negative delta flips. In one embodiment, if the number of first positive delta flips is approximately the same as the number of first negative delta flips, the first default value may be the optimal read value. In another embodiment, if the number of second positive delta flips is approximately the same as the number of second negative delta flips, the second default value may be the optimal read value.

In response to determining that the read voltages are at optimal values, the shifted read module 504 may indicate a read failure. In some embodiments, the shifted read module 504 may indicate a read failure if only one of the read voltages is at optimal values, while in other embodiments, the shifted read module 504 may indicate a read failure if both of the read voltages are at optimal values. In certain embodiments, instead of indicating a read failure, the shifted read module 504 may employ a slower and/or more robust GCL search.

In response to determining that the read voltages are not at the optimal values, the shifted read module 504 may determine whether the first default value is optimal in the negative direction. This may be accomplished by determining whether the first negative delta flips are less than the first positive delta flips. In response to determining that the first default value is optimal in the negative direction, the shifted read module 504 may modify the first default value to equal the first default value plus the negative delta. Moreover, in response to determining that the first default value is not optimal in the negative direction, the shifted read module 504 may modify the first default value to equal the first default value plus the positive delta.

The shifted read module 504 may then determine whether the second default value is optimal in the negative direction. This may be accomplished by determining whether the second negative delta flips are less than the second positive delta flips. In response to determining that the second default value is optimal in the negative direction, the shifted read module 504 may modify the second default value to equal the second default value plus the negative delta. Moreover, in response to determining that the second default value is not optimal in the negative direction, the shifted read module 504 may modify the second default value to equal the second default value plus the positive delta.

The shifted read module 504 may read the memory cells using the first and second default values. The shifted read module 504 may determine whether the data stored in the memory cells is successfully decoded. In response to determining that the data stored in the memory cells is unsuccessfully decoded, the shifted read module 504 may store the results of the read (e.g., such as in a data latch and/or read buffer) and return to reading the memory cells using the first default value plus the positive delta and the second default value plus the positive delta. In some embodiments, the shifted read module 504 may iteratively shift the first and/or second default values in a direction of decreasing bit flips and re-read data from the memory cells until a rate of bit flips increases.

In certain embodiments, the shifted read module 504 may read memory cells using one or more shifted values in response to both unsuccessfully reading the storage cell using a table entry of a DRT and unsuccessfully reading the storage cell using a table entry of a GCL.

In one embodiment, in response to unsuccessfully reading memory cells via iterative attempts, the shifted read module 504 may iteratively attempt to read the memory cells using table entries of a global table (e.g., GCL) until the memory cells are successfully read using a successful table entry of the global table.

In some embodiments, the storage module 506, in response to successfully reading a memory cell, may add information to a storage device. The storage device may be a DRT, a memory device, a table, and so forth. The information may include one or more shifted values, one or more values from a GCL, and/or one or more cases from the GCL. In certain embodiments, the storage module 506 deletes a GCL case (e.g., table entry) from the GCL (e.g., table) after adding the GCL case to the storage device. In some embodiments, the storage module 506 may indicate a read success after adding information to the storage device.

Figure 5B:
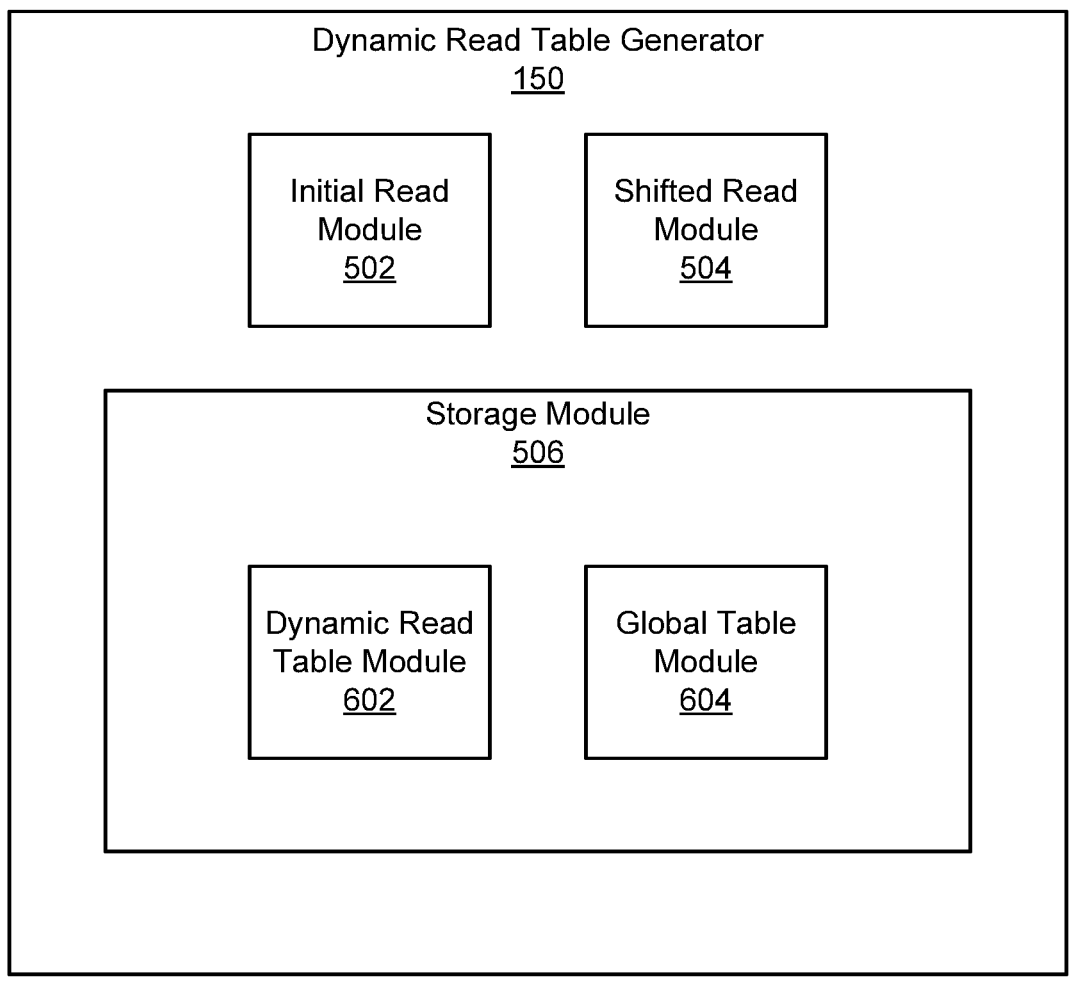
FIG. 5B is a schematic block diagram illustrating a further embodiment of a dynamic read table generator.

Turning to FIG. 5B, a further embodiment of a DRT generator 150 is illustrated. The DRT generator 150 may be substantially similar to the DRT generator 150 described above with regard to FIGS. 1A, 1B, 2, 3, and/or 5. In the depicted embodiment, the DRT generator 150 includes the initial read module 502, the shifted read module 504, and the storage module 506 and further includes a DRT module 602 and a global table module 604.

In one embodiment, the DRT module 602 includes a DRT (or other stored elements) that includes table entries used for a single die that includes a memory cell to be read. In another embodiment, the DRT module 602 includes a DRT (or other stored elements) that includes table entries used for multiple dies that include a memory cell to be read. In some embodiments, the DRT may be generated and sorted and/or pruned over time. For example, when a DRT case facilitates a successful decode, the DRT case may be moved to become the first case in the DRT table. Accordingly, the DRT case may be tried first during the next run through of the DRT table. In certain embodiments, counters may be used by the DRT to track how often cases are used. For example, each time a DRT case is used, a counter corresponding to that DRT case may be incremented (e.g., such as incrementing by 10). Over time the counter may be exponentially reduced (e.g., every 1000 read operations the counter may be multiplied by 0.9). If the counter falls below 1, that case may be removed from the DRT and added to the GCL.

In certain embodiments, the global table module 604 includes a global table (e.g., GCL) including table entries used for multiple die including a single die having a memory cell to be read. In some embodiments, the global table module 604 includes a global table including table entries for a single die having a memory cell to be read. As explained herein, using failed bit counts, a global table may be searched through faster to reduce time. In various embodiments, the global table may be sorted based on most recent passing cases to facilitate finding a passing case faster.

Figure 6A:
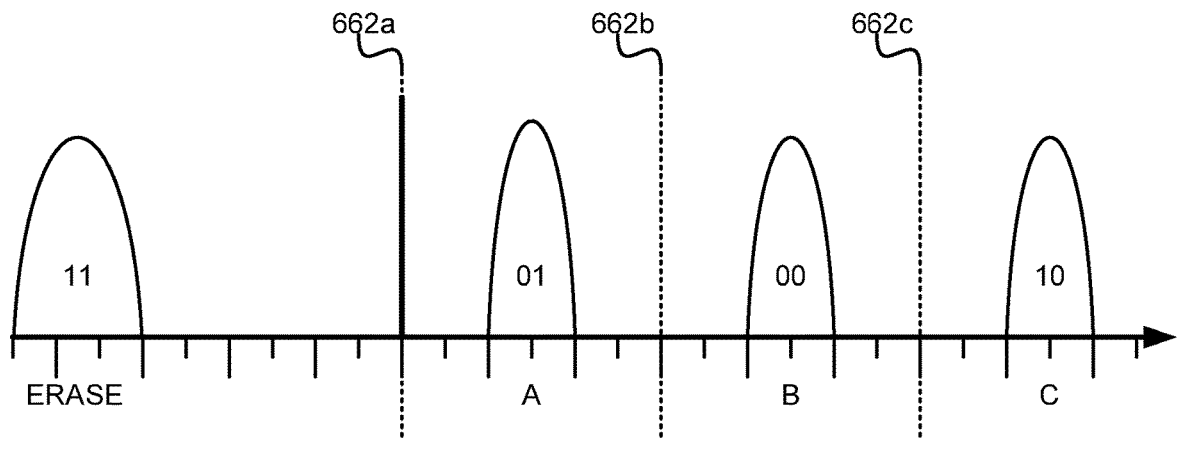
FIG. 6A is a schematic block diagram illustrating one embodiment of parameters for storage cells.

FIG. 6A shows one embodiment of parameters 662a-c for a set of multi-level storage cells, such as MLC NAND flash storage cells, or the like, with an example encoding or programming model. Any limitations inherent in the represented encoding model do not necessarily apply to all other encoding models, and the present disclosure should not be construed as inherently containing any such limitations. The read voltage states, in the depicted embodiment, are encoded using a Gray code encoding model, with binary values for adjacent states differing by a single bit in the encoding.

FIG. 6A shows that the value "11" is associated with the lowest read voltage state (labeled ERASE, an "erase" state), the value "01" is associated with the next lowest read voltage state (labeled A), the value "00" is associated with the next highest read voltage state (labeled B), and the value "10" is associated with the highest read voltage state (labeled C). In FIG. 6A, the lowest read voltage state ERASE is depicted as a negative voltage. Values, magnitudes, sizes, and the like of read voltages may vary by manufacturer and type of non-volatile memory cell, each of which are encompassed by the present disclosure. The parameters 662, in the depicted embodiment, are read voltage thresholds 662 that separate states ERASE, A, B, and C, as described above.

The non-volatile memory controller 126, 244 interprets the four discrete levels of voltage stored in the multi-level storage cell as representing two binary bits one represented by a most significant bit (MSB) in the cell encoding and one represented by a least significant bit (LSB) in the cell encoding. As explained above, other programming and encoding models may be used. Also, certain non-volatile memory media 122 may have more than four possible states, as described below with regard to FIG. 6C, allowing more than two binary values to be stored in a single multi-level storage cell, triple-level storage cell, quad-level storage cell, or the like. The voltage level abodes or storage states ERASE, A, B, and C may or may not be contiguous; for example, in certain embodiments, the voltage level abodes or storage states are separated by band gaps known as guard band. For example, the ERASE and A states may be separated by 0.3V, or the like.

In one embodiment, the LSB corresponds to a lower page of data and the MSB corresponds to an upper page of data. In certain embodiments, the multi-level storage cell may adhere to a two-phase programming model, which requires that the LSB be written to before the MSB can be written or vice versa. In another embodiment, the LSB and MSB may be programmed separately by the non-volatile memory controller 126, 244. Such an approach may be taken due to vendor or manufacturer requirements for page pairing (e.g., a LSB bit of MLC cell is paired with an MSB bit of a different MLC cell) and page addressing (e.g., LSB page must be programmed before the MSB page or vice versa). In certain instances, the LSB must be written before the MSB is written, the MSB must be written before the LSB is written, or the like.

In certain embodiments, the non-volatile memory media 122 may employ a two-phase programming model for MLC, a three-page programming model for TLC, or the like. In such a model, a binary value is first written to the LSB by way of a first write command to the lower page. The write command causes the multi-level storage cell to move from its initial state (for example, a 11 state in the ERASE state) to an intermediate state (the lower-to-middle LM state—between A and B states or the like) configured such that a 00 state is subsequently read. For example, writing a "0" to the lower page causes the multi-level storage cell to change from the ERASE state (where both the LSB and the MSB are 1) to the B state (where the LSB is changed to a 0). A subsequent write of a "0" to the upper page moves the multi-level storage cell from the intermediate state (typically between the A state and the B state) to the B state such that both bits of the MLC are "0". Thus, in such an embodiment, two writes (one to the lower page and one to the upper page) are needed to move the multi-level cell from ERASE to B, since the cell transitions through the intermediate state and the MLC device requires that the lower page be programmed before the upper page and does not allow partial programming of a page without an intervening erase operation. Writing a "1" to either of the upper page or lower page will cause the MLC to transition to either A or C depending on the binary value of the lower page at the time. In addition, certain non-volatile memory media vendors may impose a requirement that the lower page must be written to before the upper page, or the like. In other embodiments, the non-volatile memory media 122 may employ a two-phase programming model where a binary value is first written to the MSB by way of a first write command to the upper page.

In certain embodiments, the dynamic read table generator 150 determines and manages read voltage thresholds 662 or other parameters individually for one or more of the abodes ERASE, A, B, C, determining different settings or adjustments to parameters in the different abodes ERASE, A, B, C as described above. For both Gray code encoding (as depicted in FIG. 6A) and binary code encoding of bit values, the LSB of a multi-level storage cell transitions between a binary zero and a binary one between the middle two abodes or states, the A state and the B state in the depicted embodiment.

For other encoding models, the MSB may transition between a binary zero and a binary one between the middle two abodes or states, or the like. For Gray code or binary code encoding models, the LSB has a value of "1" for read voltages in a lower range (including the lower two states or abodes, ERASE and A) and the LSB has a value of "0" for read voltages in an upper range (including the upper two states or abodes, B and C).

For certain types of multi-level storage cells, the middle read voltage threshold 662b and the adjacent A and B states may be more sensitive to read disturb or other factors that can cause read voltages to drift. Further, as described above, in certain embodiments, the LSB and the MSB of a single multi-level storage cell may represent data stored in different physical pages. In certain embodiments, a read voltage threshold 662 deviates toward a larger read voltage in response to a data error or bit error indicating that storage cell values for the LSBs have transitioned from a binary one to a binary zero. For an LSB to transition from a binary one to a binary zero, a read voltage for a multi-level storage cell using the encoding model of FIG. 6A must drift from either an ERASE or A state to a B or C state, indicating that one or more of the read voltage thresholds 662 should be increased, to place the read voltage back in the original ERASE or B state.

Similarly, in certain embodiments, a read voltage threshold 662 may deviate toward a smaller read voltage in response to a data error indicating that storage cell values for the LSBs have transitioned from a binary zero to a binary one. For an LSB to transition from a binary zero to a binary one, a read voltage for a multi-level storage cell using the encoding model of FIG. 6A must drift from either a C or B state to an A or ERASE state, indicating that one or more of the read voltage thresholds 662 should be decreased, to place the read voltage back in the original C or B state.

Figure 6B:
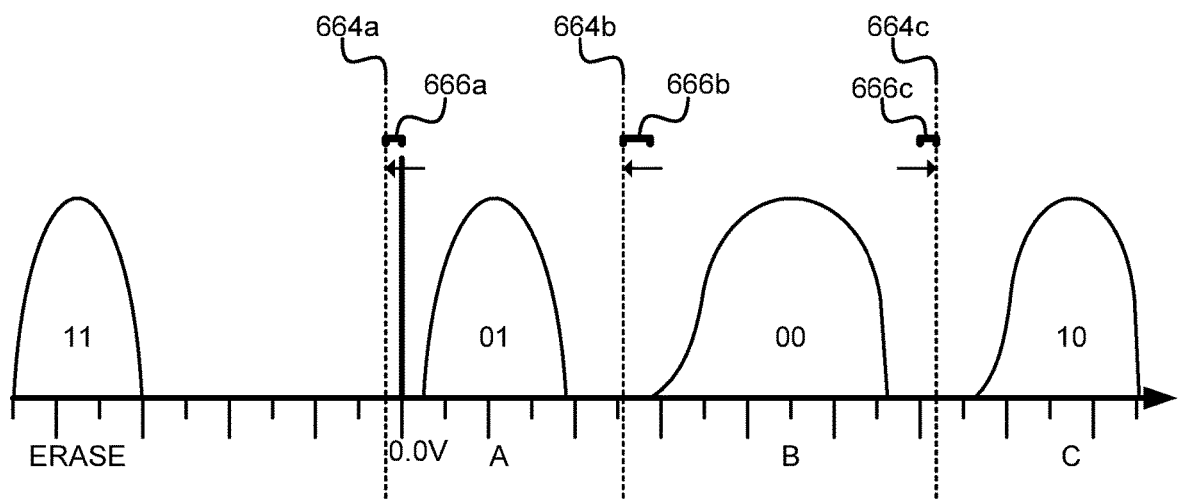
FIG. 6B is a schematic block diagram illustrating one embodiment of adjusted parameters for storage cells.

FIG. 6B depicts one embodiment of adjusted parameters 664a-c for a set of multi-level storage cells of non-volatile memory media 122. In certain embodiments, the parameters 662a-c of FIG. 6A are default parameters, set by a manufacturer, a vendor, or the like and the dynamic read table generator 150 adjust the default parameters 662a-c to the adjusted parameters 664a-c, as described above. The dynamic read table generator 150, in one embodiment, determines different adjustments 666a-c to the default parameters 662a-c resulting in the different adjusted parameters 664a-c. In the depicted embodiment, the dynamic read table generator 150 determines the different adjustments 666a-c individually for the different abodes ERASE, A, B, C, with different magnitudes, different directions, and the like, customizing the different adjusted parameters 664a-c. In another embodiment, the dynamic read table generator 150 may adjust the parameters 664a-c together in parallel, or the like.

The adjusted parameters 664a-c more closely match the actual distributions of storage cell states of FIG. 6B than do the default parameters 662a-c. Were a corresponding set of storage cells to use the default parameters 662a-c with the distributions of storage cell states of FIG. 6B, the portions of the distributions that have drifted past the locations of the default parameters 662a-c would register data errors. Similarly, because the charge levels of the different abodes ERASE, A, B, C have drifted, leaked, been disturbed, or the like by different amounts and in different directions, using the same adjustment 664 for each abode ERASE, A, B, C, in certain embodiments, may register data errors. By configuring the corresponding set of storage cells to use the individually adjusted parameters 664a-c, the configuration module 150 and the configuration module 150 prevent, avoid, or correct the potential data errors by determining the adjusted parameters 664a-c based on one or more models determined by the model module 306, as described above.

Figure 6C:
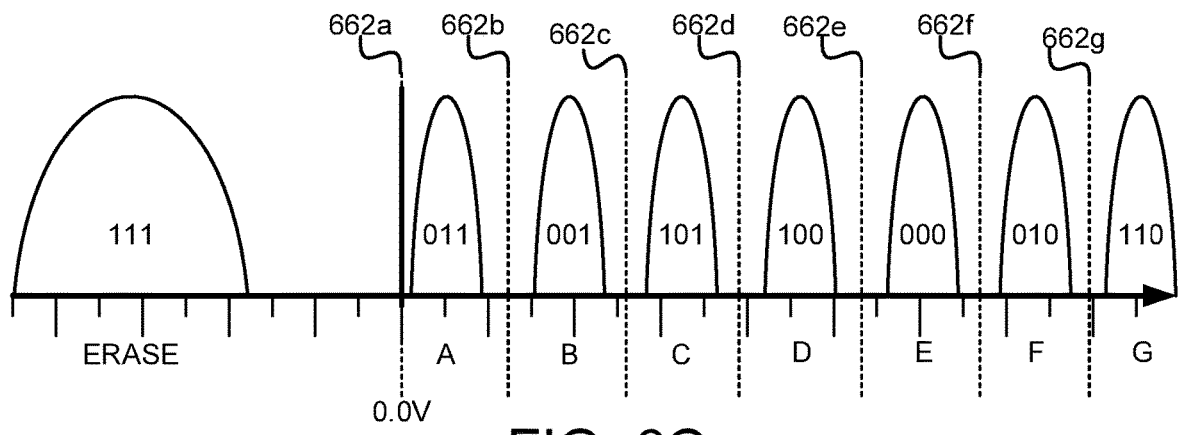
FIG. 6C is a schematic block diagram illustrating a further embodiment of parameters for storage cells.

FIG. 6C is a schematic block diagram illustrating one embodiment of parameters 662a-g for a set of triple-level storage cells of non-volatile memory media 122, with an example encoding or programming model. Any limitations inherent in the represented encoding model do not necessarily apply to all other encoding models, and the present disclosure should not be construed as inherently containing any such limitations. The read voltage states, in the depicted embodiment, are encoded using a Gray code encoding model, with binary values for adjacent states differing by a single bit in the encoding.

Performing a reliable read on TLC memory media 122, in certain embodiments, may be a more difficult task since a read window between program states A-G may be narrower than in MLC memory media 122, as depicted in FIGS. 6A-6B. As wear-out effects start to change the cell characteristics, the read window may get smaller and more bit errors may be generated during reads as a result.

Figure 7:
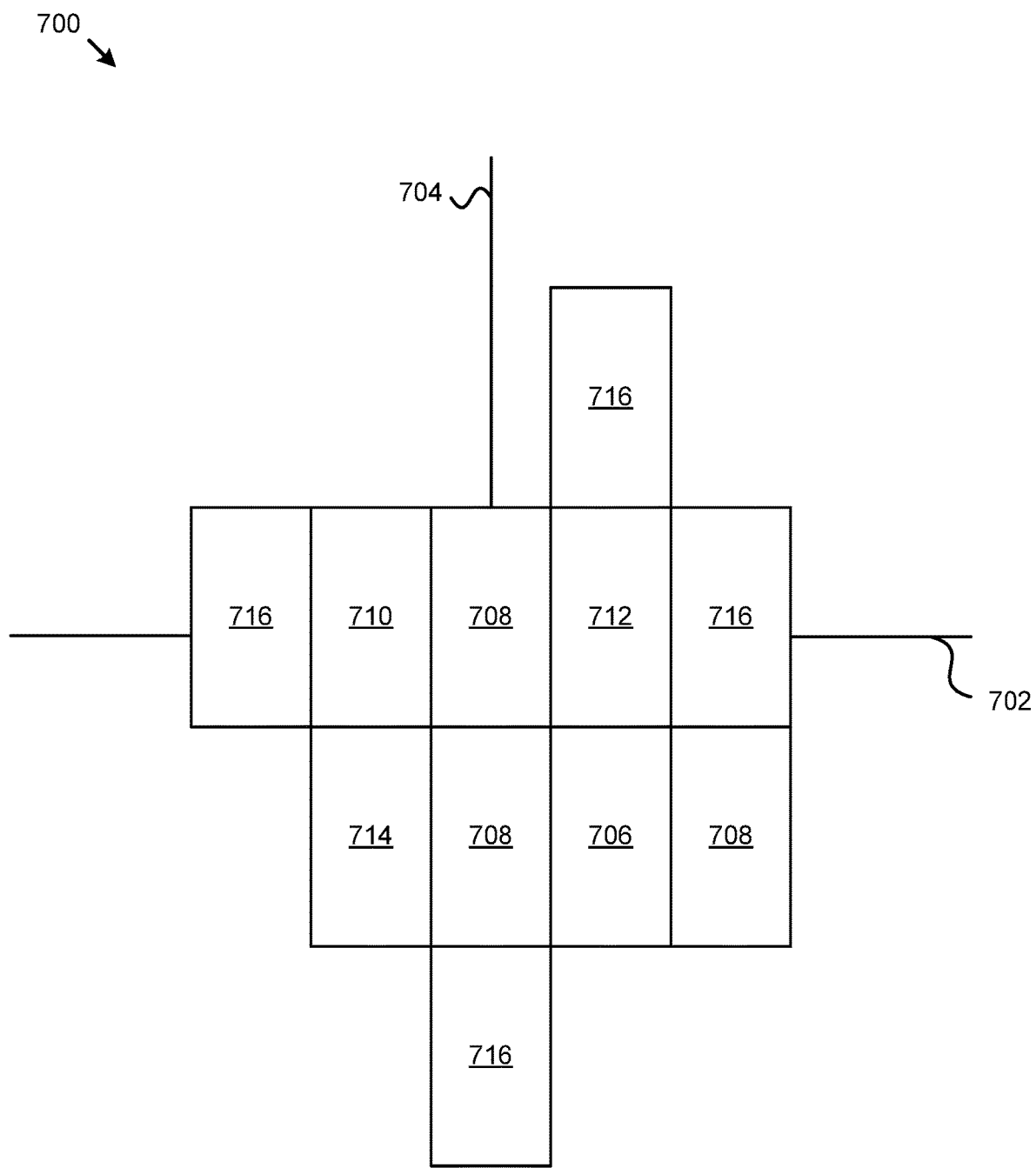
FIG. 7 is a graph illustrating one embodiment of values for reading storage cells.

Turning to FIG. 7, a graph 700 illustrates one embodiment of values for reading storage cells. In various embodiments, a single DRT may be used for multiple and/or all memory die. In such embodiments, the DRT may cover a large number (e.g., all) of scenarios tested during qualification. Such a DRT may not be large enough or fine grained enough to cover all operating conditions for mass production. Moreover, accessing such a DRT may result in poor read performance and/or latency penalties.

FIG. 7 illustrates one embodiment for determining which entries to include in a DRT. In the graph 700, an x-axis represents a shifted value for a first state read voltage level 702 and a y-axis represents a shifted value for a second state read voltage level 704. Blocks 706, 708, 710, 712, 714, and 716 form a heat map to represent a number of memory die for which the shifted read voltage levels 702, 704 were successful for reading data, based on a manufacturer and/or vendor testing procedure, qualification procedure, or the like (e.g., for memory die of a specific device, a batch of memory die fabricated together, or the like).

Specifically, in one embodiment, the block 706 may represent the combination of shifted values indicated by the associated first state read voltage level 702 along the x-axis and the second state read voltage level 704 along the y-axis that were successful for reading the highest number of memory die; the block 708 may represent the combination of shifted values for reading the second highest number of memory die; the block 710 may represent the combination of shifted values for reading the third highest number of memory die; the block 712 may represent the combination of shifted values for reading the fourth highest number of memory die; the block 714 may represent the combination of shifted values for reading the fifth highest number of memory die; and/or the block 716 may represent the combination of shifted values for reading the smallest number of memory die (e.g., one or two memory die); or the like.

In certain embodiments, instead of including each shifted value 706, 708, 710, 712, 714, 716, which was successful for at least one die, a DRT, at least initially, may include fewer values (e.g., only the first combination of shifted values 706 and the second combination of shifted values 708; only the first combination of shifted values 706; the top three most used shifted values 706, 708, 710; the top four most used shifted values 706, 710, 712, 714; and/or another number of shifted values) to reduce a number of entries in the DRT or the like. In one embodiment, the DRT, by default or the like, may only include a single value (e.g., one read voltage level, one adjustment to a read voltage threshold, one bit line bias voltage, or the like) used as a default value, such as a most used value 706. In other embodiments, the DRT may include another predetermined number of top used values for a parameter.

FIG. 8A depicts one embodiment of a global table 720 (e.g., a GCL and/or a global dynamic read table). The global table 720, in certain embodiments, may be determined by, stored by, maintained by, and/or otherwise associated with the global table module 604 described above. In one embodiment, the global table 720 may be predetermined by a manufacturer and/or vendor using a testing procedure, qualification procedure, or the like (e.g., for memory die of a specific device, a batch of memory die fabricated together, or the like). In a further embodiment, the global table module 604 may dynamically determine and/or update the global table 720, at runtime or the like.

The global table 720 may be one example of an initial global case list (GCL), before entries have been added to a DRT from the global table 720. In the depicted embodiment, the global table 720 is for two possible read levels which are named "C" and "G". The C read level shift, in the example, may range from −200 mV to +100 mV, while the G read level shift may range from −300 mV to +100 mV. The shifts and/or adjustments, in various embodiment, may be relative to one or more default read levels, may be actual read levels, or the like. For example, each read level shift may comprise a 50 mV step, creating a total of 63 possible combinations, or the like.

The seven rows in the global table 720 represent the seven possible C read level shifts, and the nine columns represent the nine possible G read level shifts. Within the global table 720, each number or entry represents an order in which to attempt the corresponding specific combination of read level shifts (e.g., an ordered list from one to sixty-three, or the like). The order of the entries may be determined based on a number of die for which the combination of read level shifts was successful (e.g., of a test set of die, during a testing and/or qualification procedure, or the like).

In the depicted embodiment, the first entry, indicated by the number "1", comprises a 0 mV shift for both the C and G read levels (e.g., default read levels). The last entry, indicated by the number "63", comprises a +100 mV shift on the C read level, and a −300 mV shift on the G read level.

Figure 8B:
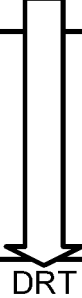
FIG. 8B is a schematic block diagram illustrating one embodiment of a global table and a dynamic read table.

FIG. 8B depicts one embodiment of a global table 720a and a dynamic read table (DRT) 730a. In certain embodiments, the global table 720a is substantially similar to the global table 720, but with eleven entries from the global table 720 moved to the DRT 730a. For example, as described above with regard to the dynamic read table module 602 and the global table module 604, in response to an entry from a global table 720a working to successfully read data from one or more storage cells (e.g., a page, a word line, an ECC code word, or the like), the storage module 506 may move an entry from the global table 720a to the die specific DRT 730a, removing the entry from the global table 720a.

For example, in the depicted embodiment, the storage module 506 has moved eleven entries from the global table 720a to the DRT 730a (e.g., to make read level adjustments for eleven or more failed read operations), removed the eleven entries from the global table 720a, and renumbered the remaining entries in the global table 720a to number one through fifty-two (e.g., from the one to sixty-three depicted in global table 720). In the depicted embodiment, the eleven entries moved from the global table 720a were not entries one through eleven from the initial global table 720, but are instead eleven entries which were used to successfully read data from the die or other storage region associated with the DRT 730a. In this manner, in certain embodiments, the initial read module 502 and/or the shifted read module 504 may quickly and efficiently attempt to read and/or re-read data from one or more storage cells using the entries in the DRT 730a which are customized to the die or other storage region comprising the one or more storage cells, without wasting the time and/or power to attempt reads with other entries from the global table 720a, even if the other entries had a higher priority in the initial global table 720 (e.g., but may have been less effective for a particular die or other storage region).

Figure 8C:
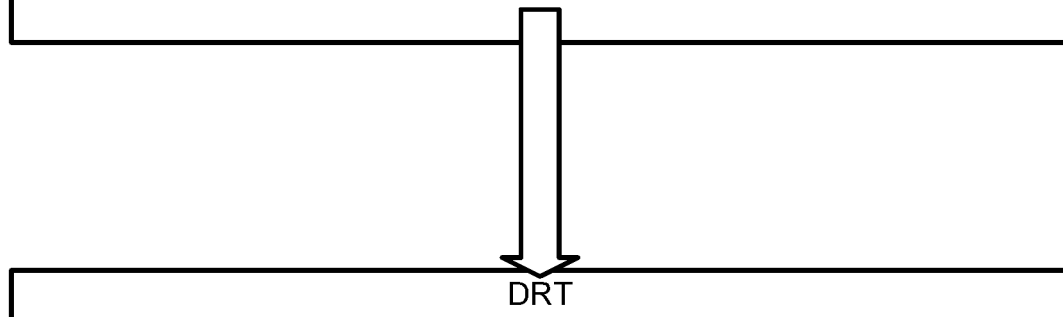
FIG. 8C is a schematic block diagram illustrating a further embodiment of a global table and a dynamic read table.

In the depicted embodiment, the die or other storage region of storage cells associated with the DRT 730a, due to certain fabrication process variations or the like, requires less negative shifts of the read levels compared to the die or other storage region of storage cells associated with the DRT 730b depicted in FIG. 8C, after being subjected to data retention or the like.

FIG. 8C depicts one embodiment of a global table 720b and a dynamic read table (DRT) 730b. The global table 720b and the DRT 730b are associated with a different die and/or other storage region than the global table 720a and DRT 730a described above with regard to FIG. 8B. Due to fabrication variations or other factors, the die or other storage region associated with the DRT 730b requires more negative read level shifts than the die or other storage region associated with the DRT 730a, so the entries moved from the global table 720b to the DRT 730b are more negative than those moved to the DRT 730a described above. In this manner, the dynamic read table generator 150, in certain embodiments, has the ability to adaptively create customized dynamic read tables 720a, 720b for individual die or other storage regions, tailored to the die's specific characteristics.

FIG. 8D depicts a further embodiment of global tables 720, 720a, 720b and dynamic read tables (DRTs) 730a, 730b. In the depicted embodiment, the global tables 720, 720a, 720b and the DRTs 730a, 730b are ordered by case and/or entry number (e.g., in an order in which the initial read module 502 and/or the shifted read module 504 may attempt to use the entries), instead of in the table format depicted in FIGS. 8A, 8B, and 8C. The ordered format depicted in FIG. 8D, in certain embodiments, may be simpler to store, update, and/or traverse as reads with different entries are attempted and as entries are removed from the global tables 720a, 720b and added to the DRTs 730a, 730b. As described above, global tables 720, 720a, 720b and/or DRTs 730a, 730b may have various formats and may be stored using various data structures, and the non-limiting examples provided herein are given by way of example.

Figure 9:
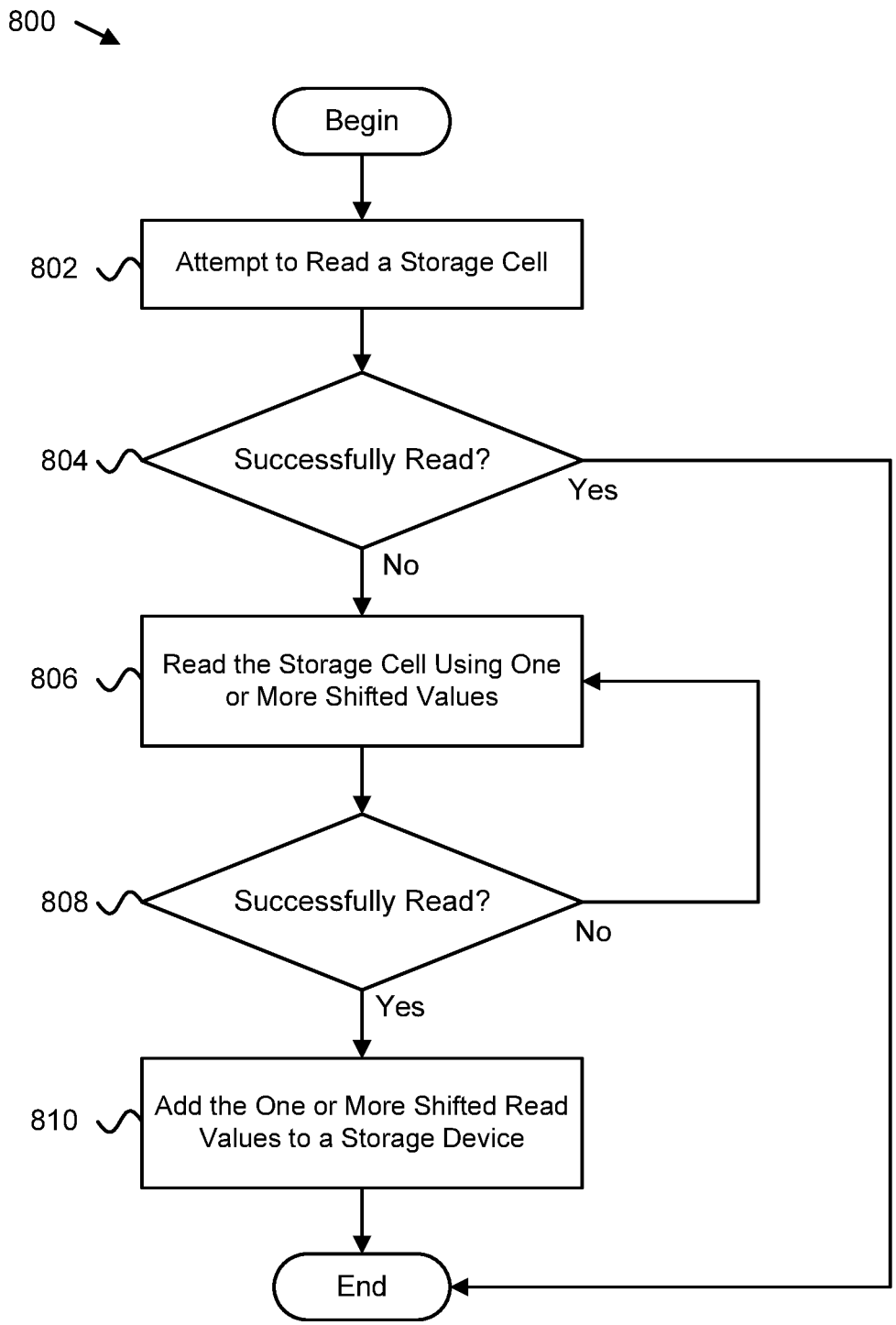
FIG. 9 is a schematic flow chart diagram illustrating one embodiment of a method for dynamic read table generation.

FIG. 9 depicts one embodiment of a method 800 for DRT generation. The method 800 begins and the initial read module 502 attempts 802 to read a storage cell of a set of non-volatile storage cells using a parameter (e.g., from a register, one or more table entries in a DRT, or the like). The initial read module 502 determines 804 whether the storage cell is successfully read. In response to the initial read module 502 successfully reading the storage cell, the method 800 may end.

In response to the initial read module 502 unsuccessfully reading the storage cell, the shifted read module 504 reads 806 the storage cell using one or more shifted values (e.g., shifted read values, shifted voltage values, or the like). The shifted read module 504 determines 808 whether the storage cell is successfully read using the one or more shifted values. In response to the shifted read module 504 unsuccessfully reading the storage cell, the method 800 returns to reading 806 the storage cell using one or more shifted values. In response to the shifted read module 504 successfully reading the storage cell, the storage module 506 adds 810 the one or more shifted values to a storage device (e.g., a DRT, a database, a table, a buffer, or the like), and the method 800 ends.

Figure 10:
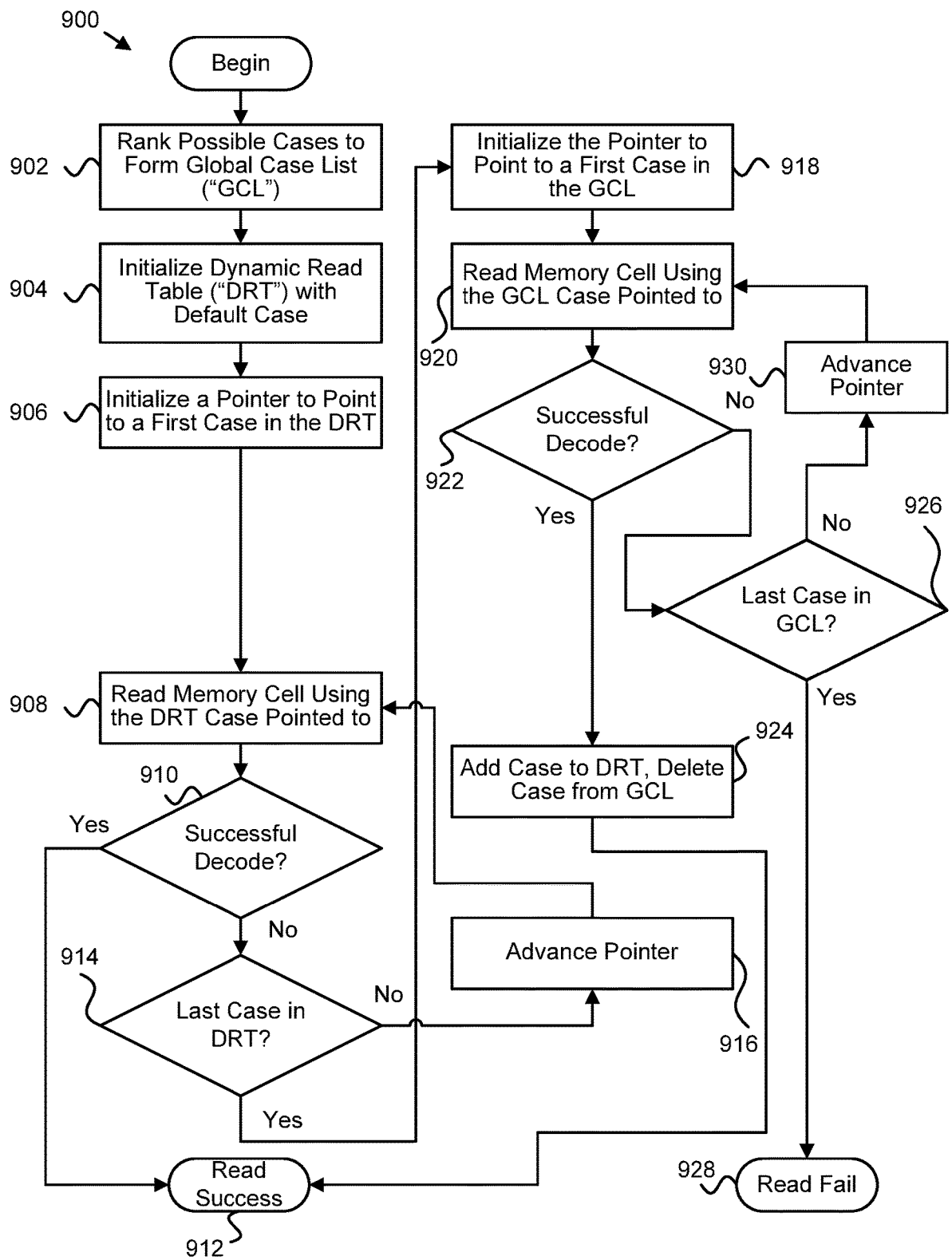
FIG. 10 is a schematic flow chart diagram illustrating another embodiment of a method for dynamic read table generation.

FIG. 10 depicts another embodiment of a method 900 for DRT generation. The method 900 begins and ranks 902 possible cases to form a GCL. The cases may be sorted by a distance from a default case. In certain embodiments, ranking 902 possible cases may be performed during manufacturing, production, and/or testing. During operation, the initial read module 502 initializes 904 a DRT with a default case. The default case may be a zero shift case. Moreover, the initial read module 502 initializes 906 a pointer to point to a first case in the DRT. The initial read module 502 reads 908 a memory cell (e.g., one or more memory cells) using the DRT case pointed to.

The initial read module 502 determines 910 whether the data stored in the memory cell is successfully decoded. In response to determining 910 that the data stored in the memory cell is successfully decoded, the initial read module 502 indicates 912 a read success. In response to determining 910 that the data stored in the memory cell is unsuccessfully decoded, the initial read module 502 determines 914 whether the case pointed to in the DRT is a last case in the table (e.g., last table entry).

In response to determining 914 that the case pointed to in the DRT is not the last case in the table, the initial read module 502 advances 916 the pointer to point to the next case in the DRT, and the method 900 returns to reading 908 the memory cell using the DRT case pointed to.

In response to determining 914 that the case pointed to in the DRT is the last case in the table, the shifted read module 504 initializes 918 the pointer to point to a first case in the GCL. By initializing the pointer to the first case in the GCL, a case that is closes to the default GCL case may be obtained. The shifted read module 504 reads 920 the memory cell using the GCL case pointed to.

The shifted read module 504 determines 922 whether the data stored in the memory cell is successfully decoded. In response to determining 922 that the data stored in the memory cell is successfully decoded, the storage module 506 adds 924 the GCL case indicated by the pointer to the DRT and deletes the GCL case indicated by the pointer from the GCL. Then the storage module 506 indicates 912 a read success.

In response to determining 922 that the data stored in the memory cell is unsuccessfully decoded, the shifted read module 504 determines 926 whether the case pointed to in the GCL is a last case in the table (e.g., last table entry). In response to determining 922 that the case pointed to in the GCL is the last case in the table, the shifted read module 504 indicates 928 a read failure (e.g., UECC).

In response to determining 922 that the case pointed to in the GCL is not the last case in the table, the shifted read module 504 advances 930 the pointer to point to the next case in the GCL, and the method 900 returns to reading 920 the memory cell using the GCL case pointed to. In this manner, the method 900 may adaptively generate a DRT.

Figure 11:
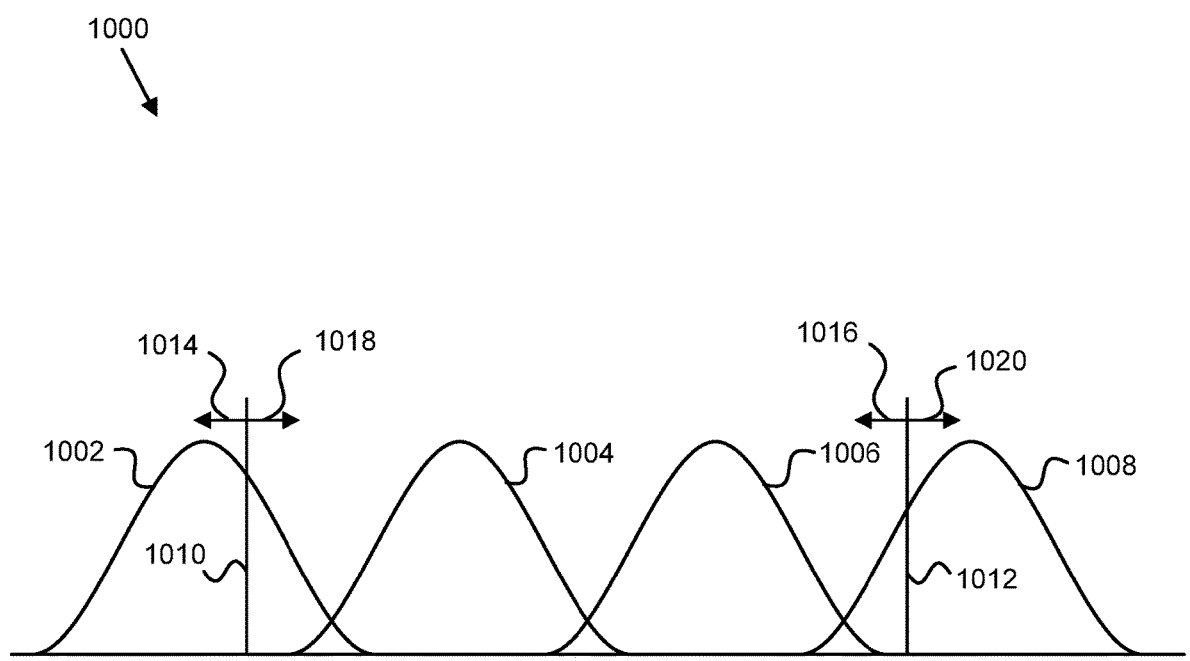
FIG. 11 is a graph illustrating one embodiment of a method for reading storage cells.

Turning to FIG. 11, a graph 1000 illustrates one embodiment of a method for reading storage cells. A first storage state 1002, a second storage state 1004, a third storage state 1006, and a fourth storage state 1008 are illustrated. In one embodiment, a lower page of the storage cells may be read using a single read. Next, the upper page of the storage cells may be initially read using two reads. The first initial read tries to perform a read using a voltage corresponding to the valley between the first storage state 1002 and the second storage state 1004. The second initial read tries to perform a read using a voltage corresponding to the valley between the third storage state 1006 and the fourth storage state 1008. In certain embodiments, the first initial read is performed using a first default value 1010, and the second initial read is performed using the second default value 1012. The initial read of the upper page gives a starting point to facilitate determining whether the first and second default values 1010 and 1012 are correctly positioned.

After the initial read of the upper page, the upper page may be read using negative deltas. Specifically, a first negative delta read may be performed using the first default value 1010 plus a first negative delta 1014, and a second negative delta read may be performed using the second default value 1012 plus a second negative delta 1016. The upper page may also be read using positive deltas. Specifically, a first positive delta read may be performed using the first default value 1010 plus a first positive delta 1018, and a second positive delta read may be performed using the second default value 1012 plus a second positive delta 1020. The results from the lower page read may be used to mask the initial upper page read, the upper page read using negative deltas, and the upper page read using positive deltas.

A first number of bit flips may be calculated by determining a number of changes in read results between using the first default value 1010 and using the first default value 1010 plus the first negative delta 1014. Moreover, a second number of bit flips may be calculated by determining a number of changes in read results between using the first default value 1010 and using the first default value 1010 plus the first positive delta 1018. A comparison may be made between the first number of bit flips and the second number of bit flips. The lower number of bit flips between the first and second numbers of bit flips indicates the direction to move the first default value 1010 to move towards the valley between the first storage state 1002 and the second storage state 1004.

For example, in an embodiment with 1024 memory cells, the read using the first default value 1010 may result in an indication that 200 memory cells are in the second storage state 1004. Moreover, the read using the first default value 1010 plus the first negative delta 1014 may result in an indication that 300 memory cells are in the second storage state 1004. Further, the read using the first default value 1010 plus the first positive delta 1018 may result in an indication that 150 memory cells are in the second storage state 1004. In such an example, the first number of bit flips may be 100 and the second number of bit flips may be 50. Because 50 is less than 100, moving the read voltage in the direction of the first positive delta 1018 is the correct direction to move towards the valley between the first storage state 1002 and the second storage state 1004.

A third number of bit flips may be calculated by determining a number of changes in read results between using the second default value 1012 and using the second default value 1012 plus the second negative delta 1016. Moreover, a fourth number of bit flips may be calculated by determining a number of changes in read results between using the second default value 1012 and using the second default value 1012 plus the second positive delta 1020. A comparison may be made between the third number of bit flips and the fourth number of bit flips. The lower number of bit flips between the third and fourth numbers of bit flips indicates the direction to move the second default value 1012 to move towards the valley between the third storage state 1006 and the fourth storage state 1008.

For example, in an embodiment with 1024 memory cells, the read using the second default value 1012 may result in an indication that 650 memory cells are in the fourth storage state 1008. Moreover, the read using the second default value 1012 plus the second negative delta 1016 may result in an indication that 800 memory cells are in the fourth storage state 1008. Further, the read using the second default value 1012 plus the second positive delta 1020 may result in an indication that 350 memory cells are in the fourth storage state 1008. In such an example, the third number of bit flips may be 150 and the fourth number of bit flips may be 300. Because 150 is less than 300, moving the read voltage in the direction of the second negative delta 1016 is the correct direction to move towards the valley between the third storage state 1006 and the fourth storage state 1008.

Figure 12:
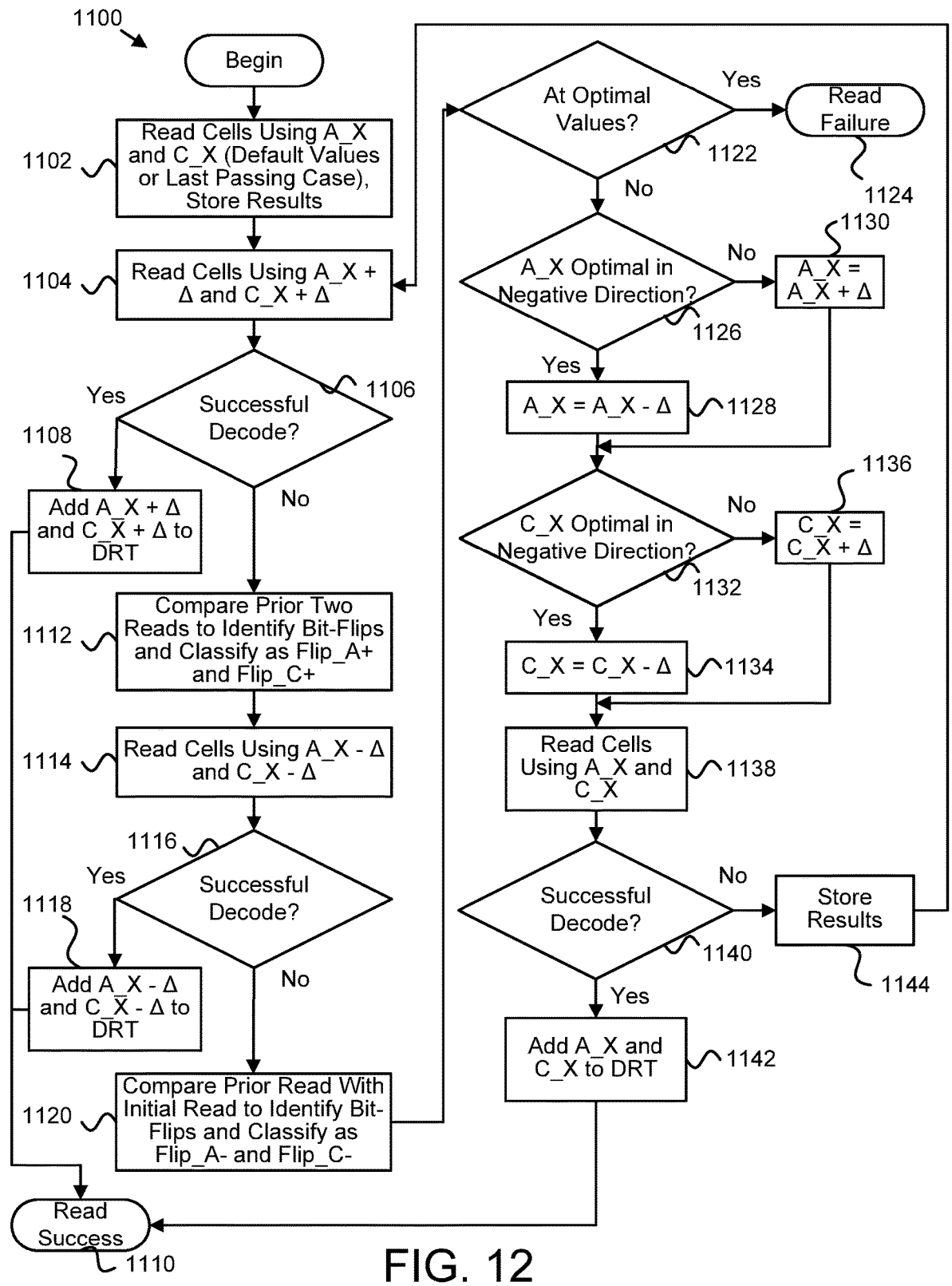
FIG. 12 is a schematic flow chart diagram illustrating a further embodiment of a method for dynamic read table generation.

FIG. 12 depicts a further embodiment of a method 1100 for DRT generation. The method 1100 begins and the shifted read module 504 reads 1102 memory cells (e.g., one or more memory cells, one or more storage cells, or the like) using one or more default values and/or last passing values (e.g., in a GCL) and stores the results (e.g., in a latch). In one embodiment, the one or more default values may be represented by A_X (e.g., a first default value) and C_X (e.g., a second default value). The shifted read module 504 may read 1104 the memory cells using A_X plus a positive delta and using C_X plus the positive delta.

The shifted read module 504 determines 1106 whether the data stored in the memory cells is successfully decoded. In response to determining 1106 that the data stored in the memory cells is successfully decoded, the storage module 506 adds 1108 A_X plus the positive delta and C_X plus the positive delta to the DRT. Then the storage module 506 indicates 1110 a read success.

In response to determining 1106 that the data stored in the memory cells is unsuccessfully decoded, the shifted read module 504 compares 1112 the prior two reads to identify a number of bit flips (e.g., a number of changes in read results). The bit flips may be classified as Flip_A+ corresponding to the number of bit flips resulting from the A_X read and the A_X plus the positive delta read. Moreover, the bit flips may be classified as Flip_C+ corresponding to the number of bit flips resulting from the C_X read and the C_X plus the positive delta read. The shifted read module 504 may read 1114 the memory cells using A_X plus a negative delta and using C_X plus the negative delta.

The shifted read module 504 determines 1116 whether the data stored in the memory cells is successfully decoded. In response to determining 1116 that the data stored in the memory cells is successfully decoded, the storage module 506 adds 1118 A_X plus the negative delta and C_X plus the negative delta to the DRT. Then the storage module 506 indicates 1110 a read success.

In response to determining 1116 that the data stored in the memory cells is unsuccessfully decoded, the shifted read module 504 compares 1120 the prior read with the initial read to identify a number of bit flips. The bit flips may be classified as Flip_A− corresponding to the number of bit flips resulting from the A_X read and the A_X plus the negative delta read. Moreover, the bit flips may be classified as Flip_C− corresponding to the number of bit flips resulting from the C_X read and the C_X plus the negative delta read.

The shifted read module 504 determines 1122 whether the read voltages A_X and/or C_X are at the optimal read values. This may be accomplished by comparing the Flip_A+ with the Flip_A−, and by comparing the Flip_C+ with the Flip_C−. In one embodiment, if the Flip_A+ is approximately the same as the Flip_A−, A_X may be the optimal read value. In another embodiment, if the Flip_C+ is approximately the same as the Flip_C−, C_X may be the optimal read value.

In response to determining 1122 that the read voltages A_X and/or C_X are at the optimal values, the shifted read module 504 may indicate 1124 a read failure. In some embodiments, the shifted read module 504 may indicate 1124 a read failure if only one of the read voltages A_X and/or C_X are at optimal values, while in other embodiments, the shifted read module 504 may indicate 1124 a read failure if both of the read voltages A_X and C_X are at optimal values. In certain embodiments, instead of indicating 1124 a read failure, the shifted read module 504 may employ a slower and/or more robust GCL search.

In response to determining 1122 that the read voltages A_X and C_X are not at the optimal values, the shifted read module 504 may determine 1126 whether A_X is optimal in the negative direction. This may be accomplished by determining whether Flip_A− is less than Flip_A+.

In response to determining 1126 that A_X is optimal in the negative direction (e.g., Flip_A−<Flip_A+), the shifted read module 504 may modify 1128 A_X to equal A_X plus the negative delta. Moreover, in response to determining 1126 that A_X is not optimal in the negative direction (e.g., Flip_A−>Flip_A+), the shifted read module 504 may modify 1130 A_X to equal A_X plus the positive delta. In certain embodiments, A_X may be optimal and blocks 1126, 1128, and 1130 may be skipped.

The shifted read module 504 may then determine 1132 whether C_X is optimal in the negative direction. This may be accomplished by determining whether Flip_C− is less than Flip_C+.

In response to determining 1132 that C_X is optimal in the negative direction (e.g., Flip_C−<Flip_C+), the shifted read module 504 may modify 1134 C_X to equal C_X plus the negative delta. Moreover, in response to determining 1132 that C_X is not optimal in the negative direction (e.g., Flip_C−>Flip_C+), the shifted read module 504 may modify 1136 C_X to equal C_X plus the positive delta. In certain embodiments, C_X may be optimal and blocks 1132, 1134, and 1136 may be skipped.

The shifted read module 504 may read 1138 the memory cells using A_X and using C_X. The shifted read module 504 determines 1140 whether the data stored in the memory cells is successfully decoded. In response to determining 1140 that the data stored in the memory cells is successfully decoded, the storage module 506 adds 1142 A_X and C_X to the DRT. Then the storage module 506 indicates 1110 a read success. In response to determining 1140 that the data stored in the memory cells is unsuccessfully decoded, the shifted read module 504 stores 1144 the results of the read (e.g., such as in a data latch) and returns to reading 1104 the memory cells using A_X plus the positive delta and C_X plus the positive delta.

In some embodiments, reading 1104 the memory cells using A_X plus the positive delta and C_X plus the positive delta may instead read the memory cells using A_X plus the positive delta and C_X plus the negative delta, read the memory cells using A_X plus the negative delta and C_X plus the positive delta, or read the memory cells using A_X plus the negative delta and C_X plus the negative delta. Furthermore, in some embodiments, reading 1114 the memory cells using A_X plus the negative delta and C_X plus the negative delta may instead read the memory cells using A_X plus the positive delta and C_X plus the negative delta, read the memory cells using A_X plus the negative delta and C_X plus the positive delta, or read the memory cells using A_X plus the positive delta and C_X plus the positive delta. The changes to blocks 1104 and 1114 may only occur on iterations through blocks 1104 and 1114 after the first iteration. Moreover, the changes to blocks 1104 and 1114 may be determined based on the optimal directions determined in blocks 1126 and 1132.

A means for performing one or more reads on a storage cell using one or more table entries of a dynamic read table, in various embodiments, may include a dynamic read table generator 150, an initial read module 502, a non-volatile storage device interface 139, a non-volatile memory medium controller 126, a storage client 116, a host computing device 110, a bus 127, a network 115, a controller (e.g., a die controller 220, a state machine 222, a controller 244, a device driver, or the like), a sense amplifier 250, a voltage source, a processor 111, other logic hardware, and/or other executable code stored on a computer readable storage medium. Other embodiments may include similar or equivalent means for performing one or more reads on a storage cell using one or more table entries of a dynamic read table.

A means for performing a low read on the storage cell using a low read value shifted by an offset and a high read on the storage cell using a high read value shifted by the offset in response to the one or more reads being unsuccessful, in various embodiments, may include a dynamic read table generator 150, a shifted read module 504, a non-volatile storage device interface 139, a non-volatile memory medium controller 126, a storage client 116, a host computing device 110, a bus 127, a network 115, a controller (e.g., a die controller 220, a state machine 222, a controller 244, a device driver, or the like), a sense amplifier 250, a voltage source, a processor 111, other logic hardware, and/or other executable code stored on a computer readable storage medium. Other embodiments may include similar or equivalent means for performing a low read on the storage cell using a low read value shifted by an offset and a high read on the storage cell using a high read value shifted by the offset in response to the one or more reads being unsuccessful.

A means for adding the low read value shifted by the offset and the high read value shifted by the offset to the dynamic read table in response to the low read on the storage cell using the low read value shifted by the offset and the high read on the storage cell using the high read value shifted by the offset being successful, in various embodiments, may include a dynamic read table generator 150, a storage module 506, a non-volatile storage device interface 139, a non-volatile memory medium controller 126, a dynamic read table module 602, a global dynamic read table module 604, a storage client 116, a host computing device 110, a bus 127, a network 115, a controller (e.g., a die controller 220, a state machine 222, a controller 244, a device driver, or the like), a processor 111, other logic hardware, and/or other executable code stored on a computer readable storage medium. Other embodiments may include similar or equivalent means for adding the low read value shifted by the offset and the high read value shifted by the offset to the dynamic read table in response to the low read on the storage cell using the low read value shifted by the offset and the high read on the storage cell using the high read value shifted by the offset being successful. In some embodiments, the dynamic read table includes a single default table entry.

A means for performing one or more reads on the storage cell using one or more table entries of a global table in response to the one or more reads using the one or more table entries of the dynamic read table being unsuccessful, in various embodiments, may include a dynamic read table generator 150, a shifted erase module 504, a storage module 506, a dynamic read table module 602, a global dynamic read table module 604, a non-volatile storage device interface 139, a non-volatile memory medium controller 126, a storage client 116, a host computing device 110, a bus 127, a network 115, a controller (e.g., a die controller 220, a state machine 222, a controller 244, a device driver, or the like), a sense amplifier 250, a voltage source, a processor 111, other logic hardware, and/or other executable code stored on a computer readable storage medium. Other embodiments may include similar or equivalent means for performing one or more reads on the storage cell using one or more table entries of a global table in response to the one or more reads using the one or more table entries of the dynamic read table being unsuccessful.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
   a set of non-volatile storage cells; and
   a controller configured to
   in response to unsuccessfully reading a storage cell of the set of non-volatile storage cells with a parameter in a stored data structure comprising a single table entry, read the storage cell using one or more shifted values for the parameter, the single table entry comprises a default entry indicating to perform a read using a nominal voltage; and
   in response to successfully reading the storage cell using the one or more shifted values for the parameter, add the one or more shifted values for the parameter to the stored data structure comprising a set of values for use during a subsequent read of the set of non-volatile storage cells.

2. The apparatus of claim 1, wherein the controller is configured to perform the read on the storage cell using the one or more shifted values in response to both unsuccessfully reading the storage cell using a table entry of a dynamic read table and unsuccessfully reading the storage cell using a table entry of a global dynamic read table, the set of values comprising the dynamic read table.

3. The apparatus of claim 1, wherein the controller is configured to, in response to unsuccessfully reading the storage cell using the one or more shifted values:
   attempt to read the storage cell using the one or more shifted values shifted by a negated offset; and
   in response to successfully reading the storage cell using the one or more shifted values shifted by the negated offset, add the one or more shifted values shifted by the negated offset to the set of values.

4. The apparatus of claim 3, wherein the controller is configured to, in response to unsuccessfully reading the storage cell using the one or more shifted values shifted by the negated offset, determine whether values for more bits flipped from values of the bits read using a table entry of a dynamic read table in response to reading the set of storage cells using the one or more shifted values or in response to reading the set of storage cells using the one or more shifted values shifted by the negated offset.

5. The apparatus of claim 4, wherein the controller is configured to iteratively shift the one or more values in a direction of fewest bit flips and re-read data from the set of storage cells until the data is successfully read.

6. The apparatus of claim 5, wherein the controller is configured to, in response to successfully reading the storage cell using the one or more iteratively shifted values, add the successful one or more iteratively shifted values to the set of values, the set of values comprising the dynamic read table.

7. The apparatus of claim 4, wherein the controller is configured to iteratively shift the one or more values in a direction of decreasing bit flips and re-read data from the set of storage cells until a rate of bit flips increases.

8. The apparatus of claim 1, wherein the one or more shifted values comprise one or more default values adjusted by an offset.

9. The apparatus of claim 1, wherein unsuccessfully reading the storage cell comprises encountering a data error in a read for the storage cell and successfully reading the storage cell comprises correctly determining stored data in a read for the storage cell.

10. A method comprising:
    iteratively attempting to read a storage cell using one or more table entries from a dynamic read table, each entry comprising a value for reading a storage cell;

in response to unsuccessfully reading the storage cell via the iterative attempts, iteratively attempting to read the storage cell using table entries of a global table until the storage cell is successfully read using a successful table entry of the global table; and adding the successful entry of the global table to the dynamic read table.

11. The method of claim 10, wherein the dynamic read table comprises table entries used for a single die comprising the storage cell and the global table comprises table entries used for multiple die comprising the single die.

12. The method of claim 10, wherein iteratively attempting to read the storage cell comprises:

initializing a pointer to an initial table entry of the dynamic read table;

attempting to read the storage cell using the initial table entry;

determining if the attempt to read the storage cell using the initial table entry is successful;

in response to the attempt to read the storage cell using the initial table entry being unsuccessful, determining if a read of the storage cell using a last table entry of the dynamic read table has been attempted; and in response to a read of the storage cell using the last table entry not having been attempted, advancing the pointer to a next table entry of the dynamic read table.

13. The method of claim 10, wherein iteratively attempting to read the storage cell using the table entries of the global table comprises:

initializing a pointer to an initial table entry of the global table;

attempting to read the storage cell using the initial table entry;

determining if the attempt to read the storage cell using the initial table entry is successful;

in response to the attempt to read the storage cell using the initial table entry being unsuccessful, determining if a read of the storage cell using a last table entry of the global table has been attempted; and in response to a read of the storage cell using the last table entry not having been attempted, advancing the pointer to a next table entry of the global table.

14. The method of claim 10, further comprising deleting the successful entry of the global table from the global table.

15. The method of claim 10, further comprising reporting a read failure in response to the iterative attempts to read the storage cell using table entries of the global table being unsuccessful.

16. The method of claim 10, wherein the dynamic read table has a single table entry comprising a default entry indicating to perform a read using a nominal voltage.

17. An apparatus comprising:

means for performing one or more reads on a storage cell using one or more table entries of a dynamic read table;

means for performing one or more reads on the storage cell using one or more table entries of a global table in response to the one or more reads using the one or more table entries of the dynamic read table being unsuccessful;

means for performing a low read on the storage cell using a low read value shifted by an offset and a high read on the storage cell using a high read value shifted by the offset in response to the one or more reads being unsuccessful; and means for adding the low read value shifted by the offset and the high read value shifted by the offset to the dynamic read table in response to the low read on the storage cell using the low read value shifted by the offset and the high read on the storage cell using the high read value shifted by the offset being successful.

18. The apparatus of claim 17, wherein the dynamic read table comprises a single default table entry for the storage cell.

19. An apparatus comprising:

a set of non-volatile storage cells; and a controller configured to:

iteratively attempt to read the set of storage cells using one or more table entries from a dynamic read table, each entry comprising a value for reading a set of storage cells;

in response to unsuccessfully reading the set of storage cells with the iterative attempts, iteratively attempt to read the set of storage cells using table entries of a global table until the set of storage cells is successfully read using a successful table entry of the global table; and add the successful entry of the global table to the dynamic read table.

* * * * *